(12) United States Patent
Briggs et al.

(10) Patent No.: US 9,418,934 B1
(45) Date of Patent: Aug. 16, 2016

(54) STRUCTURE AND FABRICATION METHOD FOR ELECTROMIGRATION IMMORTAL NANOSCALE INTERCONNECTS

(71) Applicant: International Business Machines Corporation, Armonk, NC (US)

(72) Inventors: Benjamin D. Briggs, Waterford, NY (US); Lawrence A. Clevenger, LaGrangeville, NY (US); Koichi Motoyama, Clifton Park, NY (US); Michael Rizzolo, Red Hook, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/754,999

(22) Filed: Jun. 30, 2015

(51) Int. Cl.
| | |
|---|---|
| H01L 23/48 | (2006.01) |
| H01L 23/52 | (2006.01) |
| H01L 21/4763 | (2006.01) |
| H01L 23/528 | (2006.01) |
| H01L 23/532 | (2006.01) |
| H01L 23/522 | (2006.01) |
| H01L 21/768 | (2006.01) |

(52) U.S. Cl.
CPC .......... *H01L 23/528* (2013.01); *H01L 21/7685* (2013.01); *H01L 21/76802* (2013.01); *H01L 21/76846* (2013.01); *H01L 21/76882* (2013.01); *H01L 23/5226* (2013.01); *H01L 23/53209* (2013.01); *H01L 23/53238* (2013.01)

(58) Field of Classification Search
CPC ............. H01L 23/528; H01L 23/5226; H01L 23/53209; H01L 23/53238; H01L 21/76802; H01L 21/76882; H01L 21/76846; H01L 21/7685

USPC .......... 257/751, 758, 759, 762, 767, E23.144, 257/145, 158, E21.508, E21.575, E21.576, 257/E21.584; 438/589, 592, 653, 687
See application file for complete search history.

(56) References Cited

U.S. PATENT DOCUMENTS

| | | | |
|---|---|---|---|
| 5,470,788 A | 11/1995 | Biery et al. | |
| 5,712,510 A | 1/1998 | Bui et al. | |
| 6,184,137 B1 | 2/2001 | Ding et al. | |
| 6,191,481 B1 | 2/2001 | Bothra et al. | |
| 6,727,590 B2* | 4/2004 | Izumitani | ............ H01L 23/5226 257/208 |
| 7,569,467 B2* | 8/2009 | Katou | ............... H01L 21/76843 257/E21.508 |

(Continued)

OTHER PUBLICATIONS

Hu C-K et al., "Impact of Cu Microstructure on Electromigration Reliability", IEEE, pp. 93-95 (2007).

*Primary Examiner* — Dao H Nguyen
(74) *Attorney, Agent, or Firm* — Scully, Scott, Murphy & Presser, P.C.; Steven J. Meyers

(57) ABSTRACT

After forming a trench opening including narrow trench portions spaced apart by wide trench portions and forming a stack of a first diffusion barrier layer and a first liner layer on sidewalls and a bottom surface of the trench opening, a reflow process is performed to fill the narrow trench portions but not the wide trench portions with a first conductive material layer. A stack of a second diffusion barrier layer and a second liner layer is formed on portions of the first liner layer and ends of the first conductive material layer exposed by the wide trench portions. A second conductive material layer is deposited to fill the wide trench portions. Portions of the second diffusion barrier layer and the second liner layer located between the first conductive material layer and the second conductive material layer act as vertical blocking boundaries to prevent the electromigration of metal atoms.

25 Claims, 36 Drawing Sheets

(56) References Cited

U.S. PATENT DOCUMENTS

| | | | |
|---|---|---|---|
| 7,569,475 B2 | 8/2009 | Yang et al. | |
| 8,232,646 B2 | 7/2012 | Bonilla et al. | |
| 9,232,644 B2 * | 1/2016 | Shimizu | H05K 3/389 |
| | | | 438/678 |
| 2001/0022398 A1 * | 9/2001 | Grill | H01L 21/3127 |
| | | | 257/758 |
| 2002/0005583 A1 * | 1/2002 | Harada | H01L 24/03 |
| | | | 257/758 |
| 2003/0183940 A1 * | 10/2003 | Noguchi | H01L 21/76801 |
| | | | 257/767 |
| 2003/0214043 A1 * | 11/2003 | Saitoh | H01L 21/02068 |
| | | | 257/758 |
| 2009/0294973 A1 | 12/2009 | Chanda et al. | |
| 2010/0252928 A1 * | 10/2010 | Ohtsuka | H01L 21/28556 |
| | | | 257/751 |
| 2014/0048927 A1 | 2/2014 | Burke et al. | |
| 2014/0124933 A1 | 5/2014 | Yang et al. | |

* cited by examiner

STRUCTURE AND FABRICATION METHOD FOR ELECTROMIGRATION IMMORTAL NANOSCALE INTERCONNECTS

BACKGROUND

The present application relates to interconnect structures, and more particularly to interconnect structures with enhanced electromigration performance.

Metal interconnects are used to interconnect semiconductor devices into circuits. As circuits are scaled to smaller dimensions in a continual effort to provide increased density and performance, the interconnect linewidth becomes increasingly narrow, which in turn renders metal interconnects more susceptible to deleterious effects such as electromigration. Electromigration occurs when a high density of current flows through a metal interconnect, which in turn causes metal atoms to migrate toward the anode end of the metal interconnect. Over an extended period of time, the accumulation of metal at the anode end of the metal interconnect significantly increases the local mechanical stress in the system, causing an increase in resistance or failure of the metal interconnect, both of which reduce reliability of the circuits. Therefore, there remains a need to enhance electromigration performance of metal interconnects when relative current densities through metal interconnects continue to increase as the linewidths of metal interconnects shrink.

SUMMARY

The present application provides an interconnect structure having improved electromigration reliability by forming electromigration blocking islands in the interconnect structure. The electromigration blocking islands divide the interconnect structure into segments each having a length equal or less than a Blech length, thus effectively impeding the electromigration of interconnect metal.

In one aspect of the present application, an interconnect structure is provided. In one embodiment, the interconnect structure includes a trench opening located within a dielectric material layer present on a substrate. The trench opening includes a plurality of first trench portions having a first width and at least one second trench portion having a second width greater than the first width. The at least one second trench portion separates the plurality of first trench portions from each other. The interconnect structure further includes a first diffusion barrier present on sidewalls and a bottom surface of the trench opening, a first liner present on the first diffusion barrier, and first conductive material portions present on portions of the first liner located within the plurality of first trench portions to fill remaining spaces of the plurality of first trench portions. The interconnect structure further includes an electromigration blocking island located within the at least one second trench portion and abutting respective ends of adjacent first conductive material portions. The electromigration blocking island includes a second diffusion barrier present on portions of the first liner located in the at least one second trench portion and the respective ends of the adjacent first conductive material portions, a second liner present on the second diffusion barrier, and a second conductive material portion present on the second liner. The second conductive material portion fills a remaining space of the at least one second trench portion.

In another embodiment, the interconnect structure includes a trench opening located within a dielectric material layer present on a substrate. The trench opening includes a plurality of first trench portions having a first width and at least one second trench portion having a second width greater than the first width. The at least one second trench portion separates the plurality of first trench portions from each other. The interconnect structure further includes a first diffusion barrier present on sidewalls and a bottom surface of the trench opening, a first liner present on the first diffusion barrier, and first conductive material portions present on portions of the first liner located within the plurality of first trench portions to fill remaining spaces of the plurality of first trench portions. The interconnect structure further includes an electromigration blocking island located within the at least one second trench portion and abutting respective ends of adjacent first conductive material portions. The electromigration blocking island includes a second diffusion barrier present on vertical portions of the first liner located in the at least one second trench portion and the respective ends of the adjacent first conductive material portions, a second liner present on the second diffusion barrier, and a second conductive material portion present on the second liner. The second conductive material portion fills a remaining space of the at least one second trench portion.

In another aspect of the present application, a method of forming an interconnect structure is provided. The method includes first forming a trench opening within a dielectric material layer located on a substrate. The trench opening includes a plurality of first trench portions having a first width and at least one second trench portion having a second width greater than the first width. The at least one second trench portion separates the plurality of first trench portions from each other. After forming a first diffusion barrier layer over sidewalls and a bottom surface of the trench opening followed by forming a first liner layer over the first diffusion barrier, a first conductive material layer is formed to fill the plurality of first trench portions of the trench opening. Next, a second diffusion barrier layer is formed on portions of the first liner layer and ends of the first conductive material layer exposed by the at least one second trench portion of the trench opening. After forming a second liner layer over the second diffusion barrier layer, a second conductive material layer is formed to fill the at least one second trench portion of the trench opening.

DETAILED DESCRIPTION

Figure 1A:
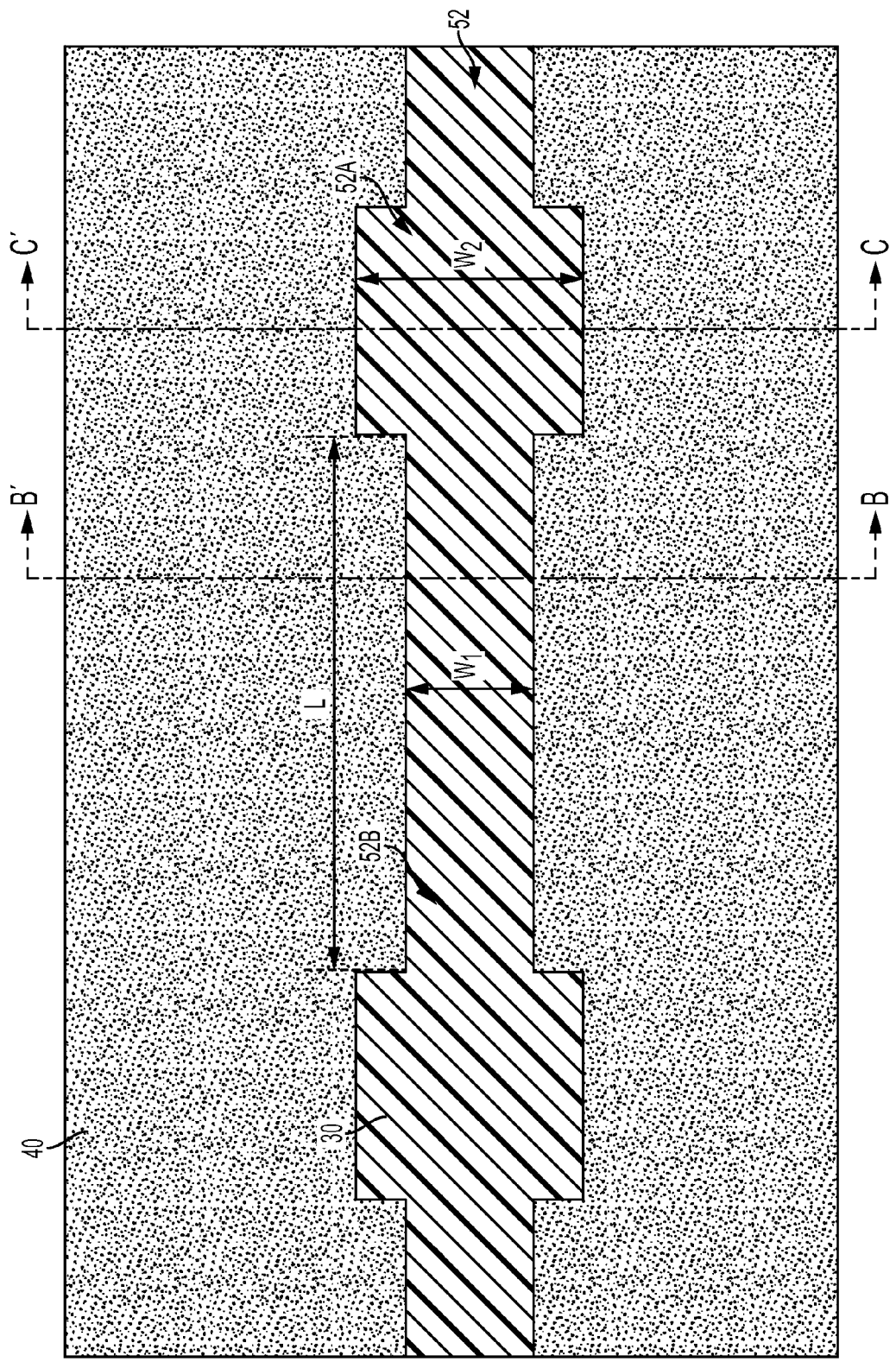
FIG. 1A is a top view of a first exemplary semiconductor structure after forming a trench opening within a material stack formed on a substrate according to a first embodiment of present application. The trench opening includes narrow trench portions spaced apart by at least one wide trench portion.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
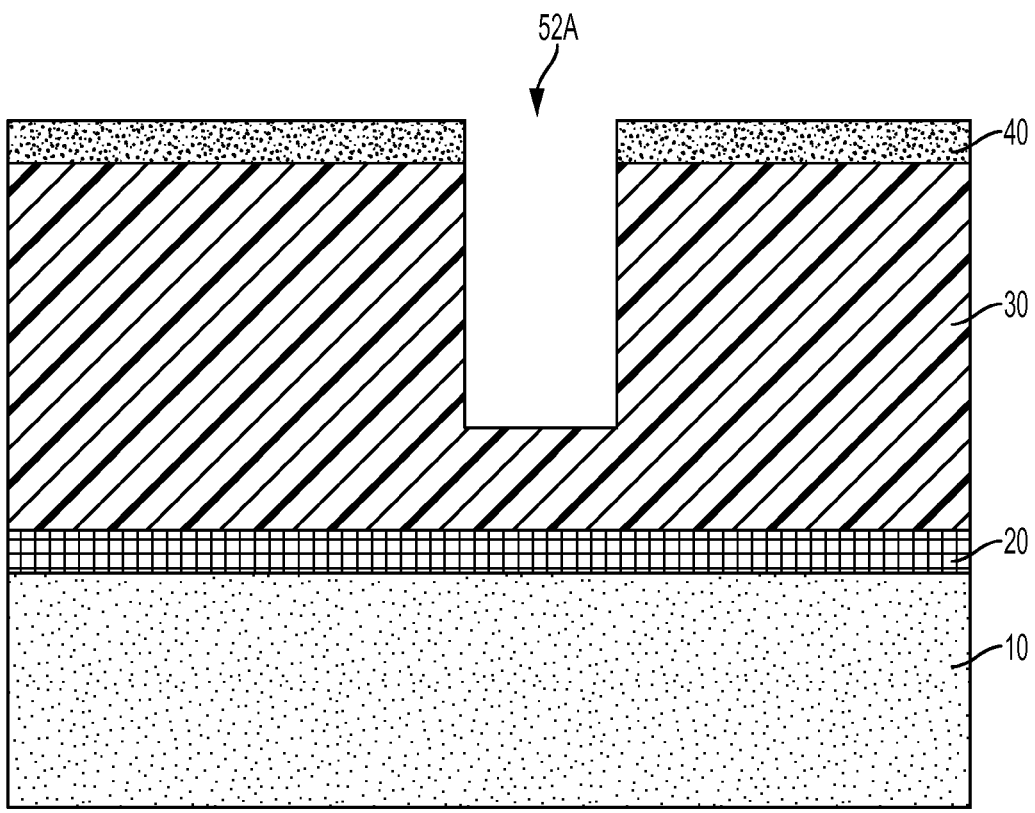
FIG. 1B is a cross-sectional view of the first exemplary semiconductor structure of FIG. 1A along line B-B'.
Figure 1C:
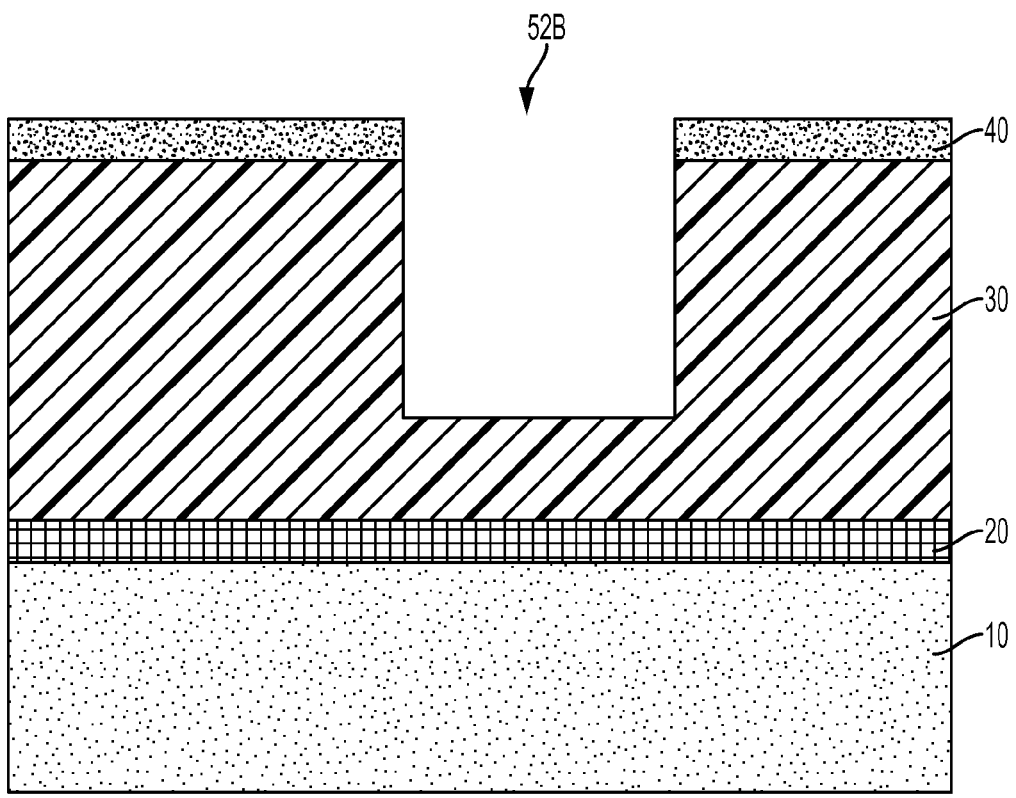
FIG. 1C is a cross-sectional view of the first exemplary semiconductor structure of FIG. 1A along line C-C'.

Referring to FIGS. 1A-1C, a first exemplary semiconductor structure according to a first embodiment of the present application includes a material stack having at least one opening formed therein. The material stack is formed on a substrate 10 and includes, from bottom to top, a dielectric cap layer 20L, a dielectric material layer 30L, a dielectric hard mask layer 40L.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include an interconnect structure including at least one dielectric material layer and metal lines and/or metal via structures embedded therein. The top surface of the substrate 10 can be planar, or can have a non-planar topography.

The dielectric cap layer 20 can protect underlying substrate 10 from impurities that may diffuse down from upper levels, and can function as a diffusion barrier layer that prevents vertical diffusion of metallic impurities, moisture, or other gaseous impurities. The dielectric cap layer 20 may include, for example, silicon nitride, silicon oxynitride, silicon carbide, nitrogen and hydrogen doped silicon carbide (SiCNH), or a combination thereof. The dielectric cap layer 20 may be formed, for example, by chemical vapor deposition (CVD) or atomic layer deposition (ALD). The thickness of the dielectric cap layer 20 can be from 25 nm to 50 nm, although lesser and greater thicknesses can also be employed. The dielectric cap layer 20 is optional and can be omitted in some embodiments of the present application.

The dielectric material layer 30 typically includes a low-k dielectric material. By "low-k" it is meant a dielectric material having a dielectric constant that is about 4.0 or less. Exemplary low-k dielectric materials include, but are not limited to, silicon dioxide, organosilicates, silsequioxanes, undoped silicate glass (USG), fluorosilicate glass (FSG), SiCOH and borophosphosilicate glass (BPSG). The dielectric material layer 30 may be formed by CVD, plasma enhanced chemical vapor deposition (PECVD) or spin coating. The thickness of the dielectric material layer 30 may be from 100 nm to 1,000 nm, although lesser and greater thicknesses can also be employed.

The dielectric hard mask layer 40 can be employed to provide a greater mechanical strength during a subsequent planarization process. Alternately or additionally, the dielectric hard mask layer 40 can be employed as an etch mask for etching the underlying layers. The dielectric hard mask layer 40 may include, for example, silicon nitride, silicon oxynitride, organosilicate, or a combination thereof. In one embodiment, the dielectric hard mask layer 40 is composed of tetraethyl orthosilicate (TEOS). The dielectric hard mask layer 40 may be formed, for example, by PECVD, CVD or ALD. The thickness of the dielectric hard mask layer 40 may be from 15 nm to 50 nm, although lesser and greater thicknesses can also be employed. The dielectric hard mask layer 40 is optional and can be omitted in some embodiments of the present application.

In one embodiment and as shown in FIG. 1A, the at least one opening includes a trench opening 52 that extends through the dielectric hard mask layer 40 into the dielectric material layer 30. The trench opening 52 includes narrow trench portions 52A extending along a lengthwise direction and having a first width $W_1$ and at least one wide trench portion 52B having a second width $W_2$ greater than the first width $W_1$. As used herein, a "lengthwise direction" is a horizontal direction along which an object extends the most. The first width $W_1$ is typically about 60% to 90% of the second width $W_2$. The first width $W_1$ can be from 18 nm to 26 nm and the second width $W_2$ can be from 20 nm to 30 nm, although lesser and greater widths can also be employed. In one embodiment, the first width $W_1$ is 18 nm, and the second width W1 is 24 nm. The wide trench portions 52B are longitudinally spaced apart along the first trench opening 52 such that each narrow trench portion 52A located between adjacent wide trench portions 52B has a length L that is equal to or less than a Blech length of an interconnect structure later formed. The Blech length represents a length below which the electromigration in the interconnect structure will not occur for any given current density. The length L of each narrow trench portion 52A depends on its width and the device operating temperature. In one embodiment, the length L of each narrow trench portion 52A can be from 2 μm to 6 μm, although lesser and greater lengths can also be employed.

The trench opening 52 can be formed by lithography and etching known in the art. Lithography includes applying a photoresist (not shown) atop the dielectric hard mask layer 40 utilizing CVD, PECVD, spin coating, chemical solution deposition or evaporation. The photoresist is then subjected to a lithographic process which includes exposing the photoresist to a pattern of radiation and developing the exposed resist utilizing a conventional resist developer. The lithographic step provides a patterned photoresist atop the dielectric hard mask layer 40 that defines the widths of the trench opening 52 to be subsequently formed in the dielectric material layer 30. The wide trench portions 52B of the trench opening 52 may be accomplished by adjusting the widths of the opening in the patterned photoresist. After providing the patterned photoresist, the pattern is transferred into the dielectric hard mask layer 40 and then subsequently into the second dielectric material layer 30 utilizing one or more etching processes. The patterned photoresist can be stripped immediately after the pattern is transferred into the dielectric hard mask layer 40 forming a patterned dielectric hard mask layer (not shown) utilizing a conventional stripping process, such as, for example, ashing. Alternatively, the patterned photoresist can be stripped after the pattern is transferred into the dielectric material layer 30. The etching used in transferring the pattern may comprise a dry etching process such as, for example, reactive ion etching (RIE), ion beam etching, plasma etching or laser ablation, a wet chemical etching process, or a combination thereof.

Figure 2A:
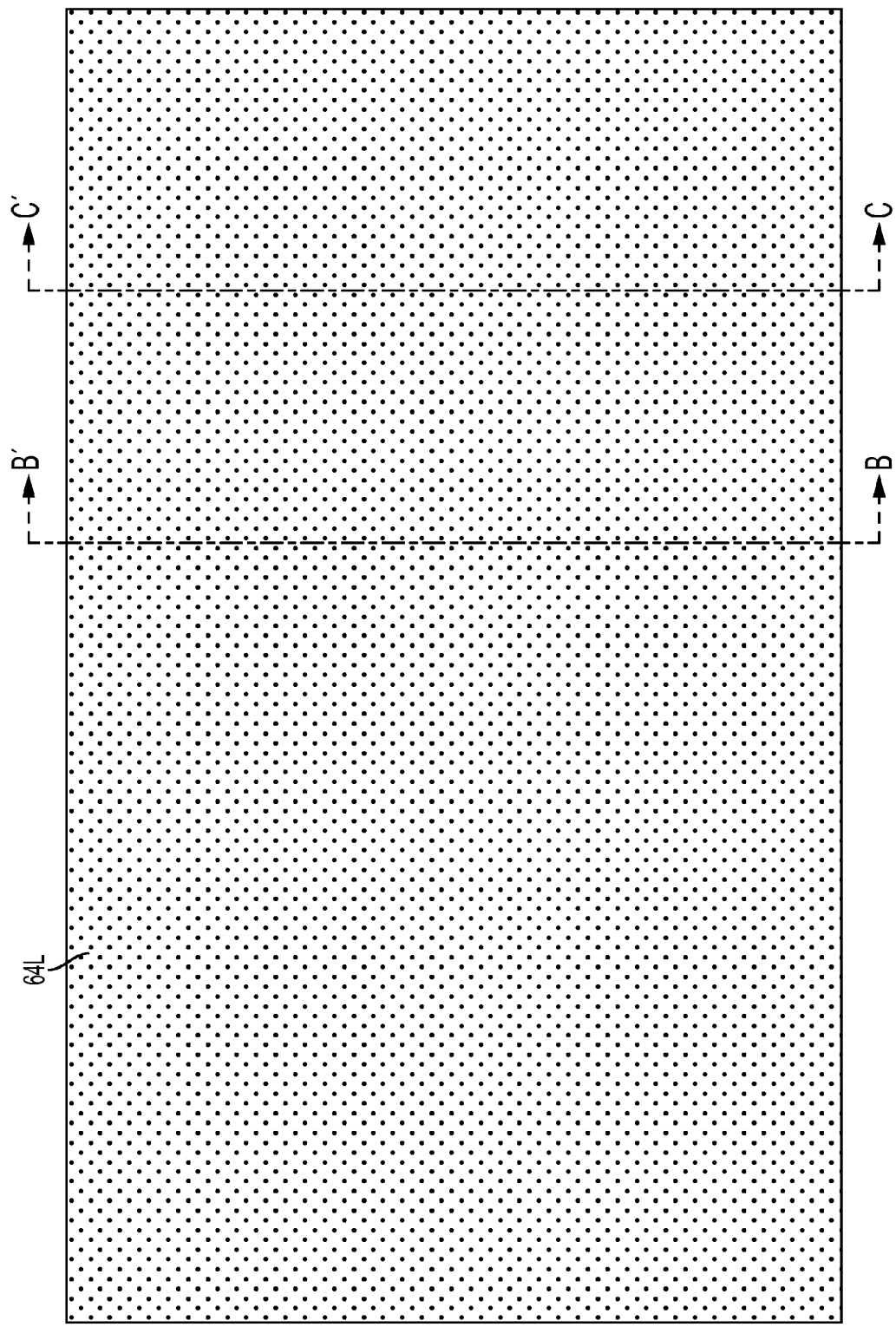
FIG. 2A is a top view of the first exemplary semiconductor structure of FIGS. 1A-1C after forming a stack of, from bottom to top, a first diffusion barrier layer and a first liner layer over sidewalls and a bottom of the trench opening and a top surface of a dielectric hard mask layer in the material stack.
Figure 2B:
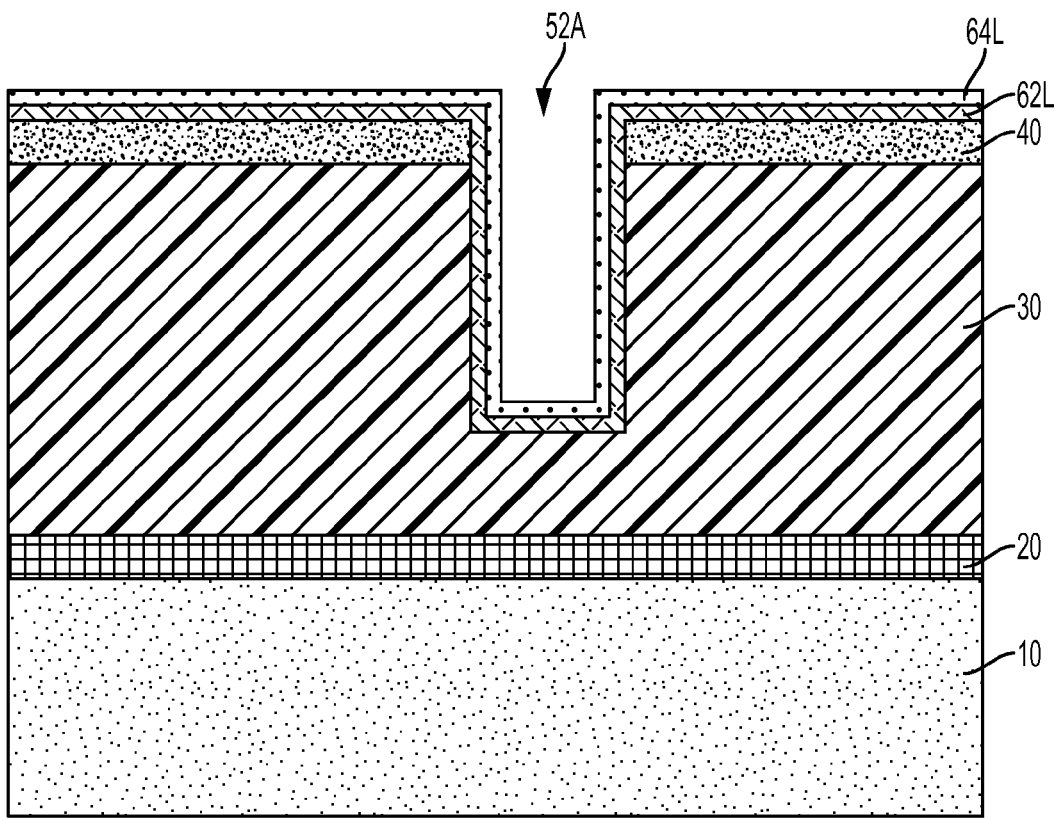
FIG. 2B is a cross-sectional view of the first exemplary semiconductor structure of FIG. 2A along line B-B'.
Figure 2C:
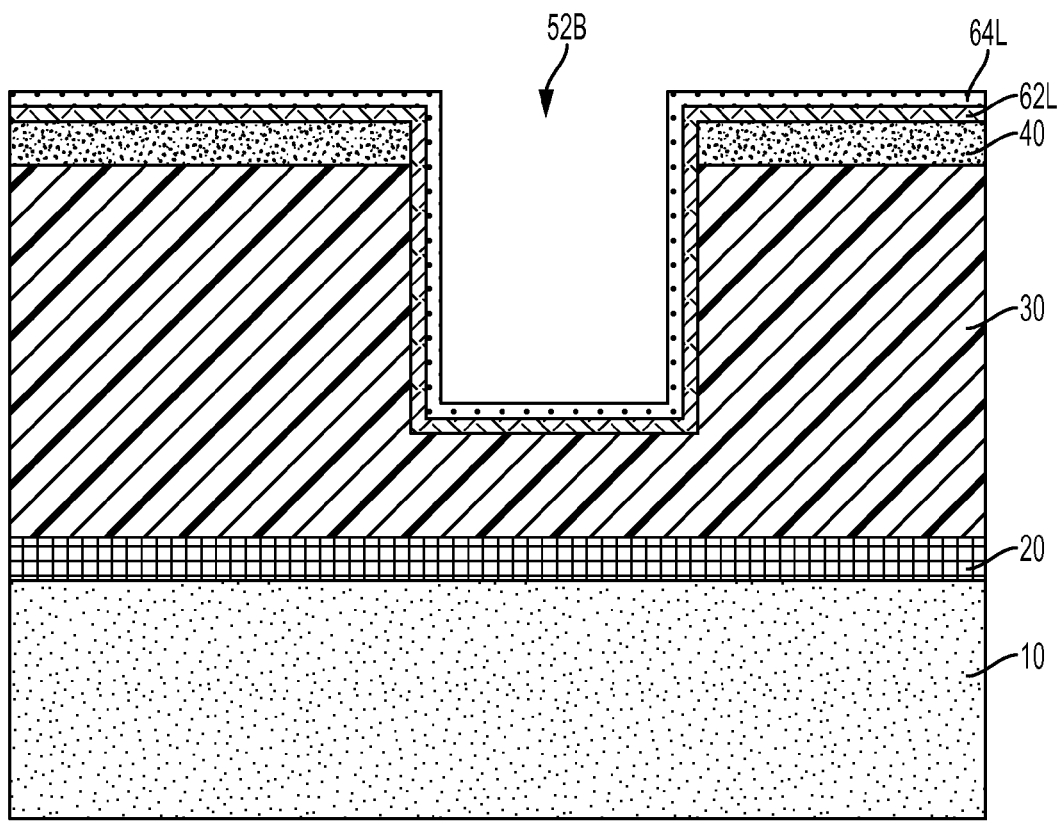
FIG. 2C is a cross-sectional view of the first exemplary semiconductor structure of FIG. 2A along line C-C'.

Referring to FIGS. 2A-2C, a first diffusion barrier layer 62L is conformally deposited over sidewalls and a bottom surface of the trench opening 52 and the top surface of the dielectric hard mask layer 40. The first diffusion barrier layer 62L serves as a barrier to prevent a conductive material from diffusing into the dielectric material layer 30. The first diffusion barrier layer 62L may include Ta, TaN, W, WN, Ti, TiN, or a stack thereof such as Ta/TaN, Ta/TaN/Ta and Ti/TiN. In one embodiment, the first diffusion layer 62L is composed of TaN. The first diffusion barrier layer 62L may be formed, for example, by CVD, ALD, PECVD or PVD. The first diffusion barrier layer 62L that is formed may have a thickness from 5 nm to 40 nm, although lesser and greater thicknesses can also be employed.

Next, a first liner layer 64L is conformally deposited by, for example, PVD, CVD or ALD onto the first diffusion barrier layer 62L. The first liner layer 64L promotes the complete filling of narrow trench portions 52A with a conductive material, while voids are substantially eliminated. The first liner layer 64L may include a noble metal such as, for example, Ru, Ir, Os, Rh, Re, Pd, Pt, Au, or alloys thereof. In one embodiment, the first liner layer 64L is composed of Ru. A thickness of the first liner layer 64L may range from 1 nm to 20 nm, although lesser and greater thicknesses can also be employed.

Figure 3A:
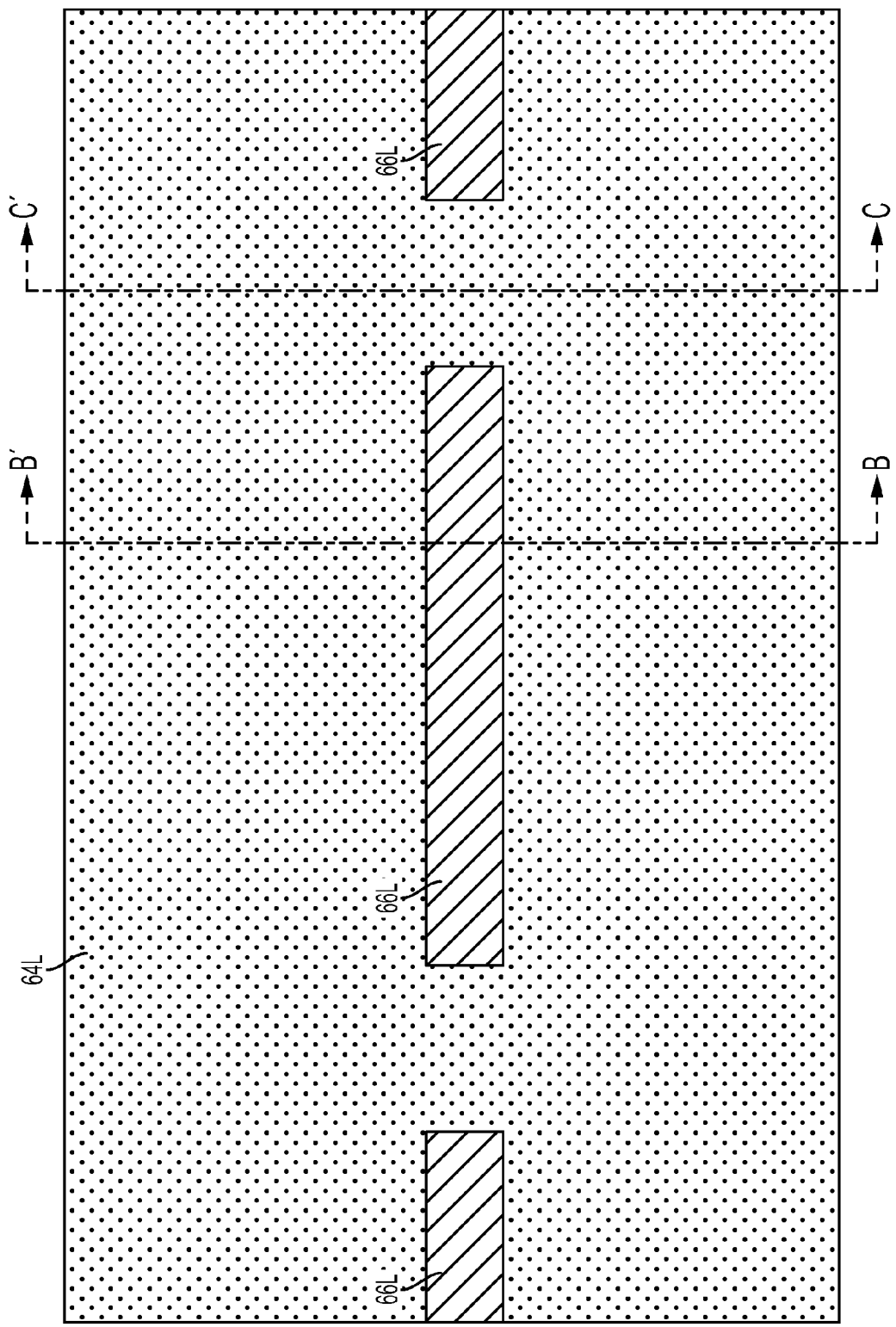
FIG. 3A is a top view of the first exemplary semiconductor structure of FIGS. 2A-2C after forming a first conductive material layer to fill the narrow trench portions but not the wide trench portions.
Figure 3B:
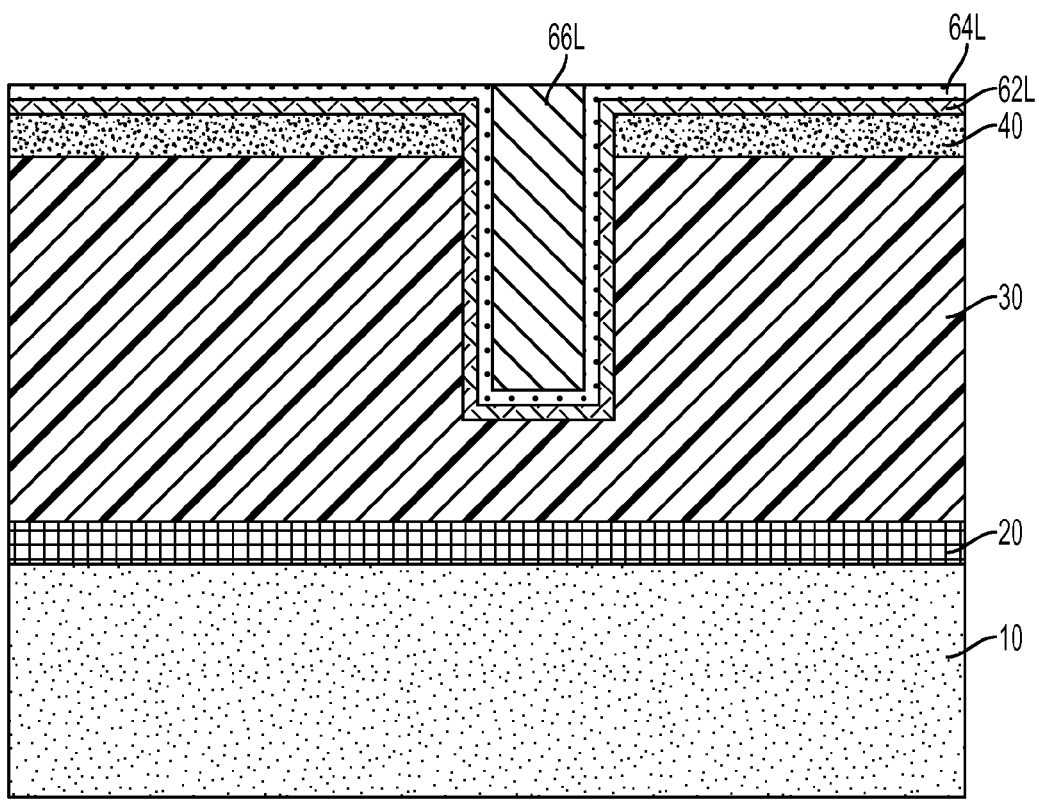
FIG. 3B is a cross-sectional view of the first exemplary semiconductor structure of FIG. 3A along line B-B'.
Figure 3C:
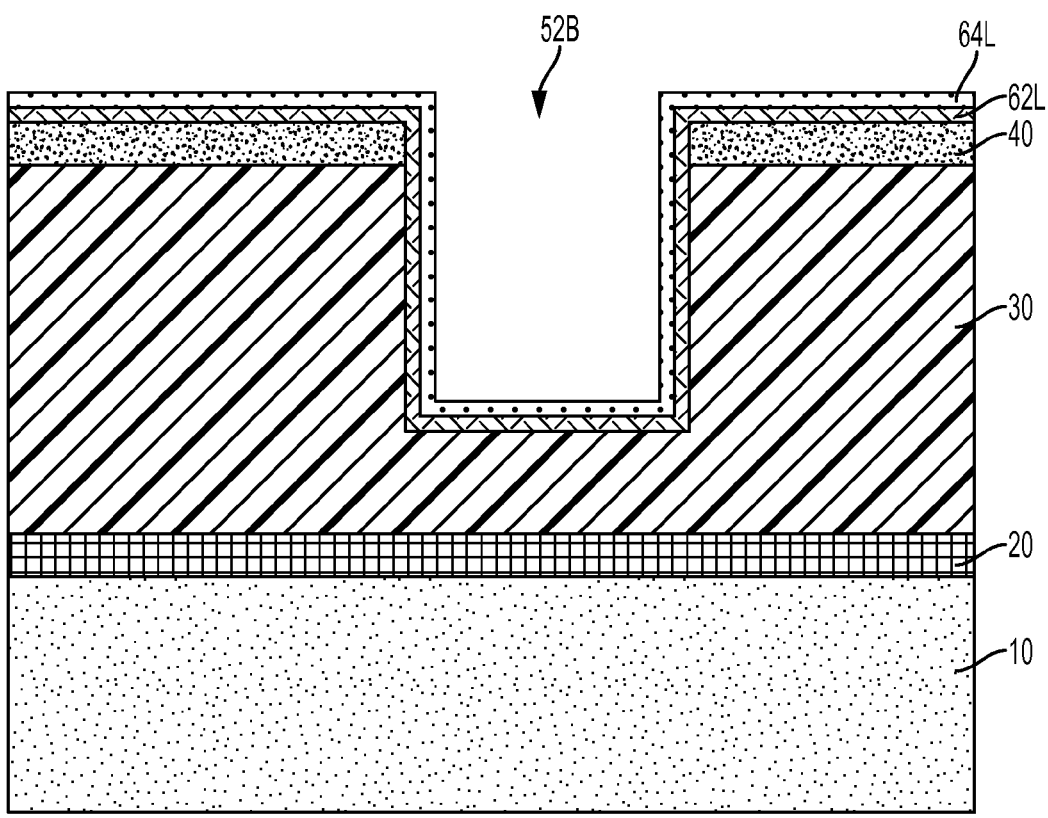
FIG. 3C is a cross-sectional view of the first exemplary semiconductor structure of FIG. 3A along line C-C'.

Referring to FIGS. 3A-3C, a first conductive material layer 66L is depositing on the first liner layer 64L by a reflow process until the narrow trench portions 52A are completely filled, whereas the wide trench portions 52B remain unfilled. The first conductive layer 66L may include Cu or Co. In some embodiments, the reflow process occurs at an elevated temperature of from 100° C. to 400° C. In some embodiments, the reflow process can be performed in an inert gas including, for example, He, Ar, Ne, $N_2$ and mixtures thereof. In other embodiments, the reflow process can be performed in a reactive gas. In one embodiment, the reactive gas is a mixture of $H_2$ and $N_2$. The reflow process creates a substantially voidfree first conductive material layer 66L within the narrow trench portions 52A of the trench opening 52.

Figure 4A:
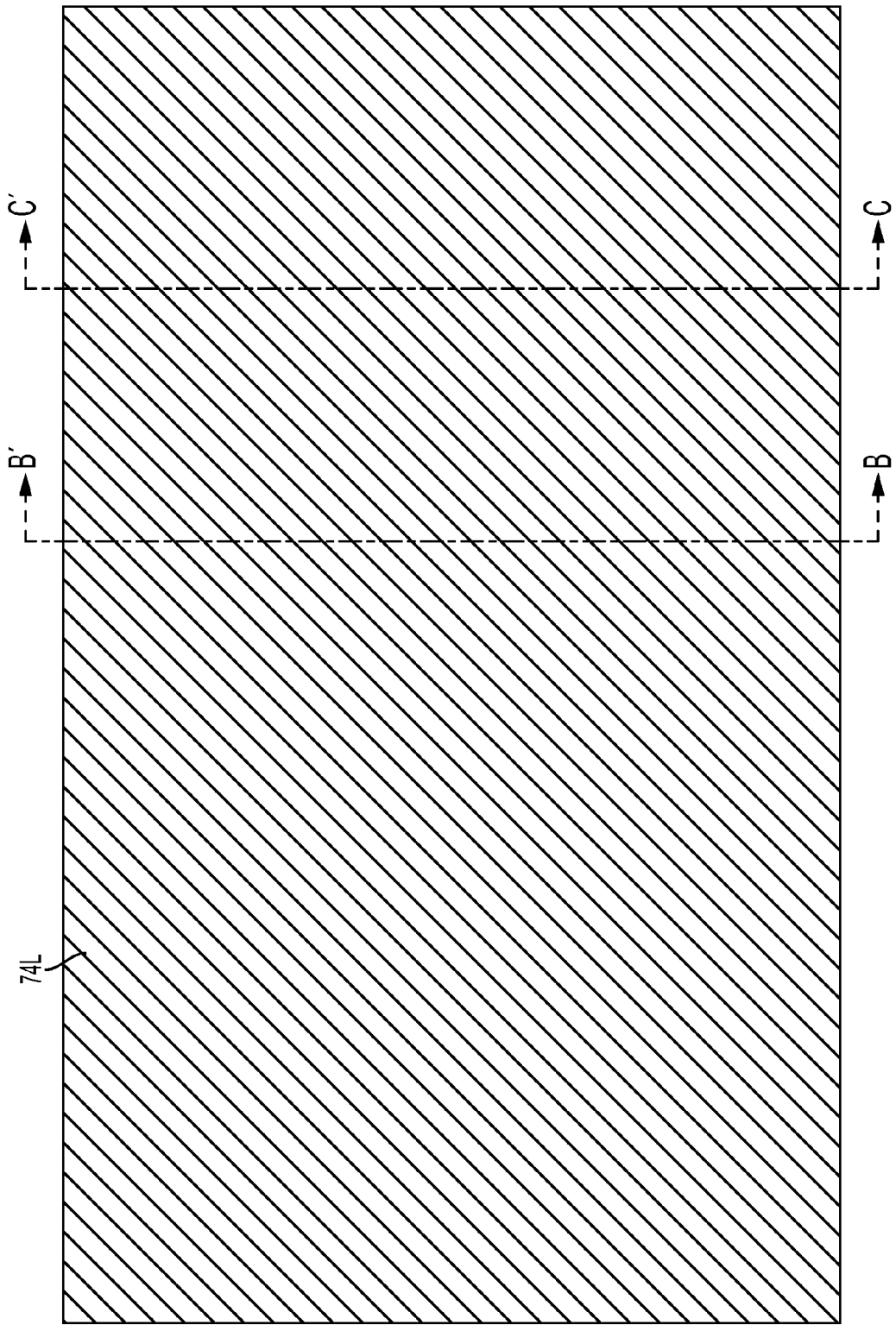
FIG. 4A is a top view of the first exemplary semiconductor structure of FIGS. 3A-3C after forming a stack of, from bottom to top, a second diffusion barrier layer and a second liner layer over the first liner layer and the first conductive material layer.
Figure 4B:
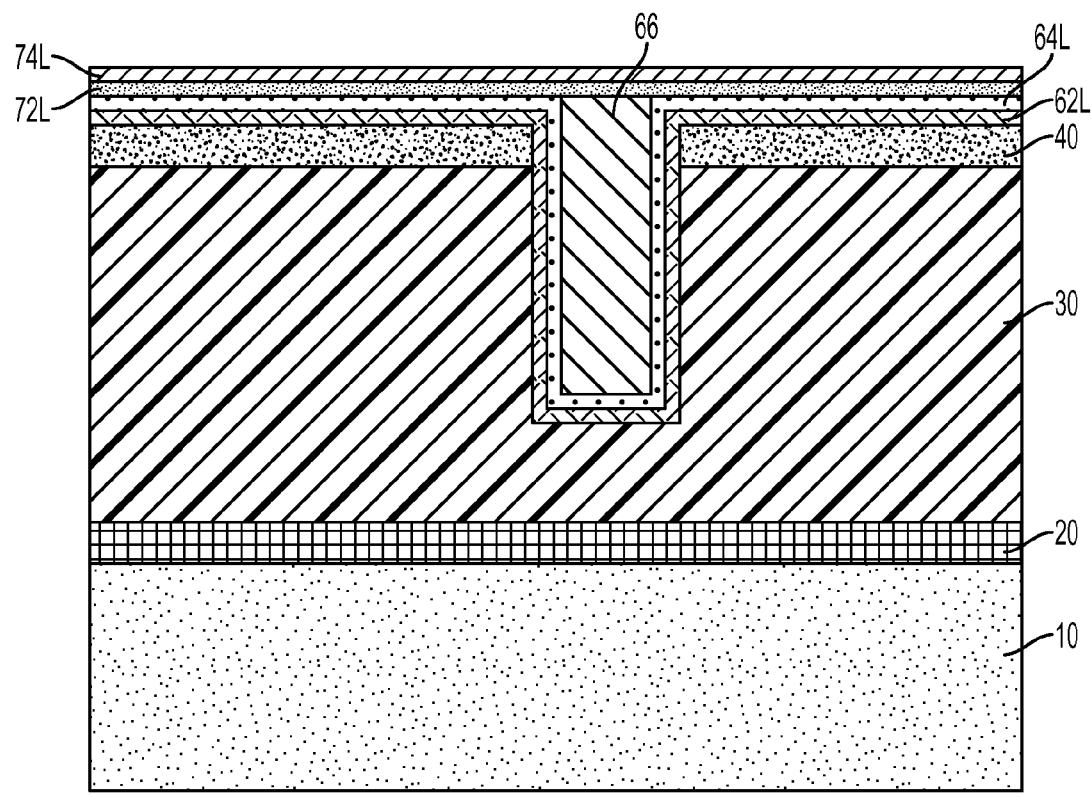
FIG. 4B is a cross-sectional view of the first exemplary semiconductor structure of FIG. 4A along line B-B'.
Figure 4C:
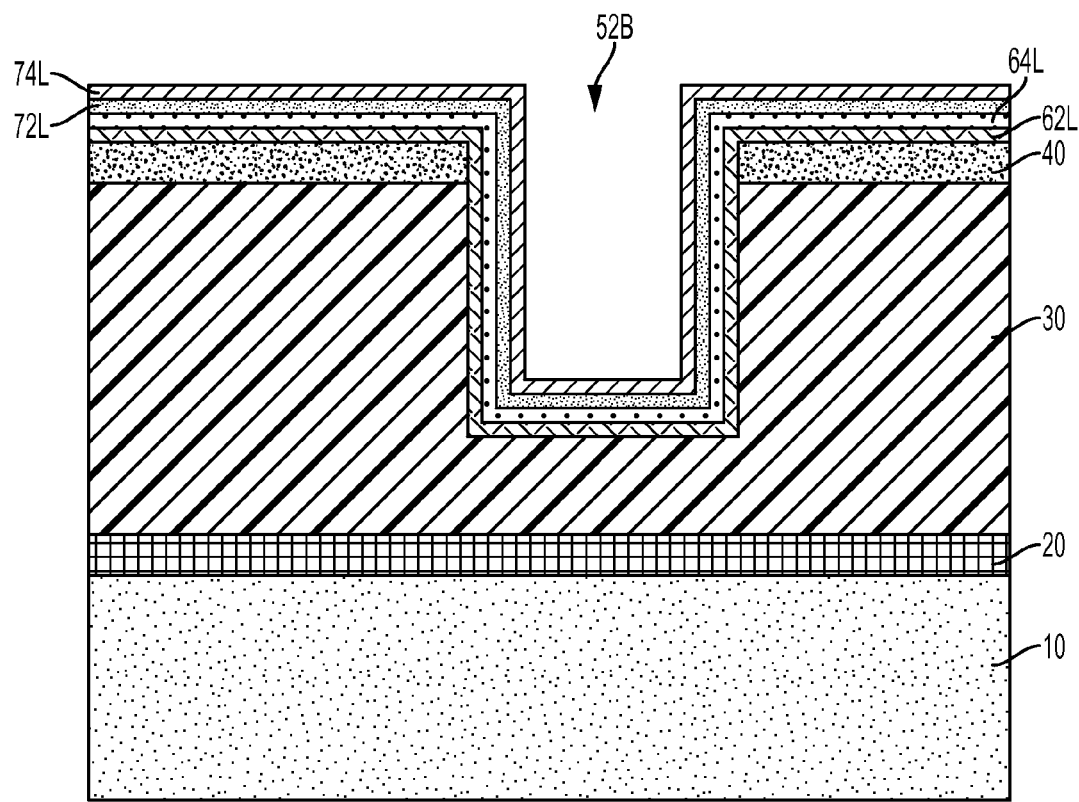
FIG. 4C is a cross-sectional view of the first exemplary semiconductor structure of FIG. 4A along line C-C'.

Referring to FIGS. 4A-4C, a second diffusion barrier layer 72L is conformally deposited over the first liner layer 64L and the first conductive material layer 66L. The second diffusion barrier layer 72L may include a metal that is the same, or different from, the metal of the diffusion barrier layer 62L.

Subsequently, a second liner layer 74L is conformally deposited over the second diffusion barrier layer 72L. The second liner layer 74L may include a metal that is the same, or different from, the metal of the first liner barrier layer 64L. The processing techniques and thickness ranges described above for each of the first diffusion barrier layer 62L and the first liner layer 64L are also applicable here for the formation of the second diffusion barrier layer 72L and the second liner layer 75L.

Figure 5A:
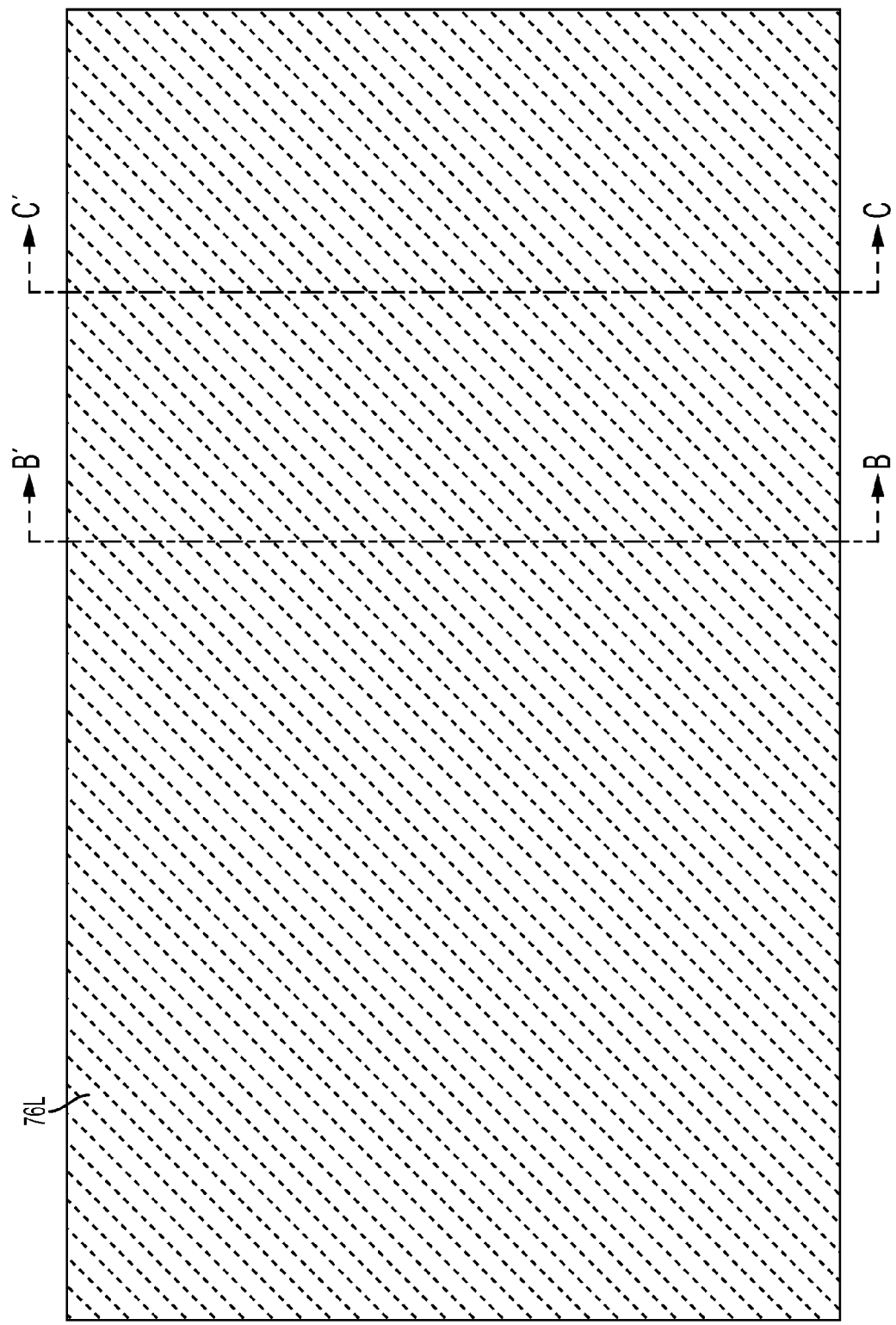
FIG. 5A is a top view of the first exemplary semiconductor structure of FIGS. 4A-4C after forming a second conductive material layer over the second liner layer to fill the wide trench portions.
Figure 5B:
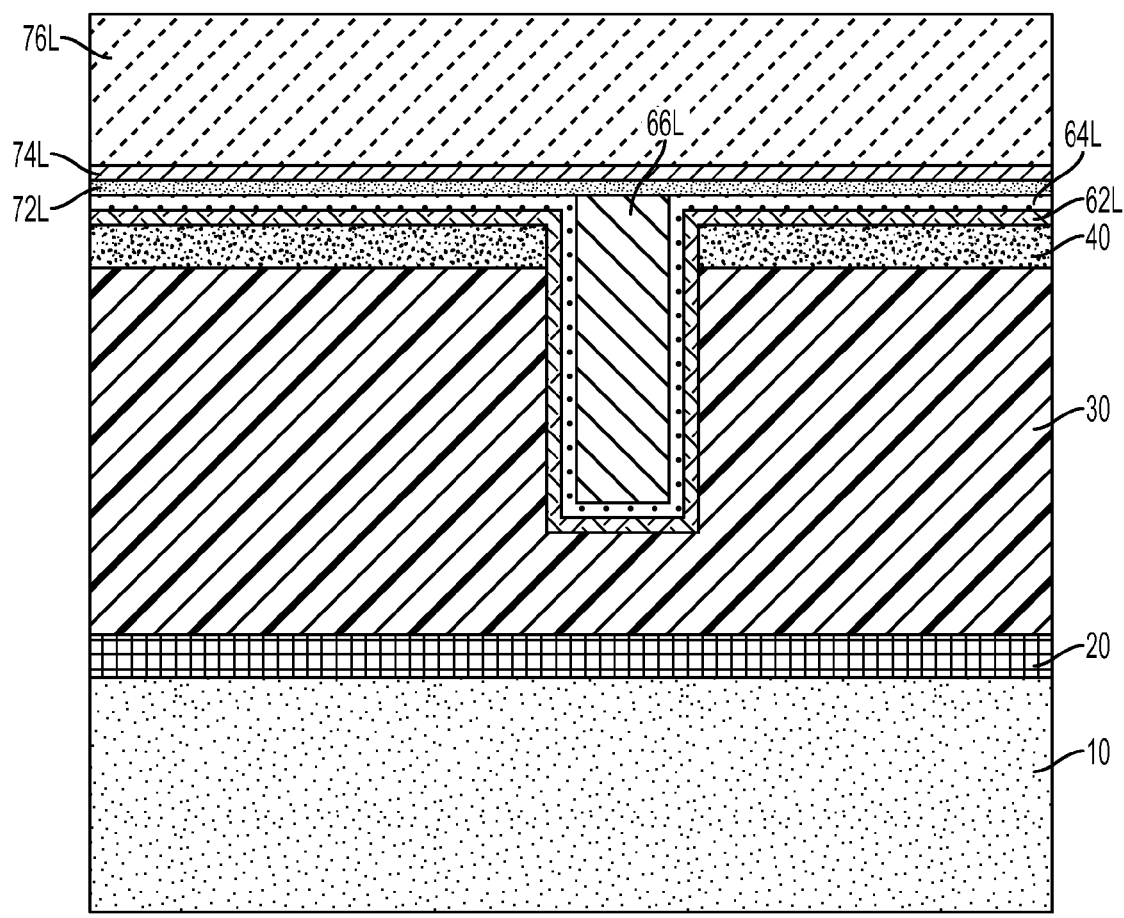
FIG. 5B is a cross-sectional view of the first exemplary semiconductor structure of FIG. 5A along line B-B'.
Figure 5C:
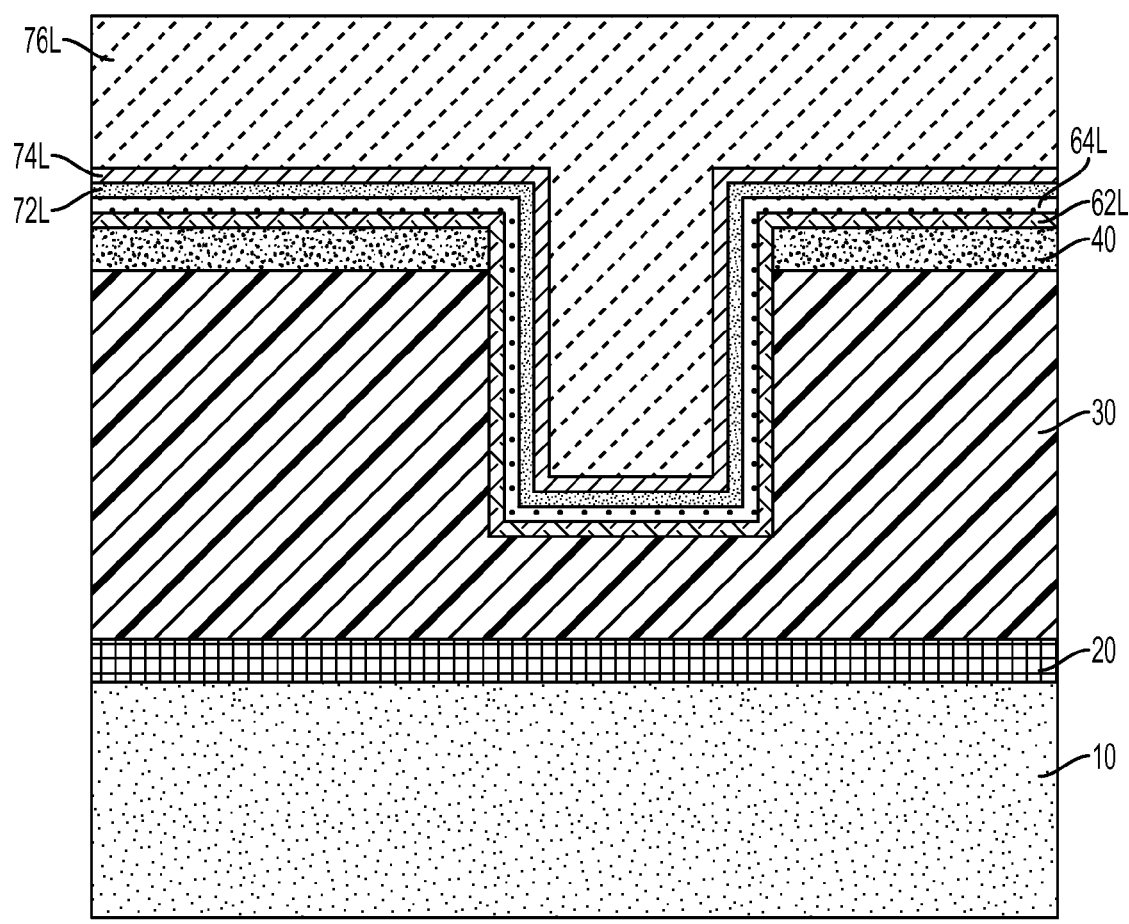
FIG. 5C is a cross-sectional view of the first exemplary semiconductor structure of FIG. 5A along line C-C'.

Referring to FIGS. 5A-5C, a second conductive material layer 76L is deposited over the second liner layer 74L to completely fill the wide trench portions 52B of the trench opening 52. The second conductive material layer 76L may include a conductive material that is the same, or different from, the conductive material of the first conductive material layer 66L. The second conductive material layer 76L may be formed by a conventional deposition process such as, for example, CVD, PVD, ALD, or plating. The second conductive material layer 76L is deposited to a thickness so that a top surface of the second conductive material layer 76L is located above the topmost surface of the second liner layer 74L.

Figure 6A:
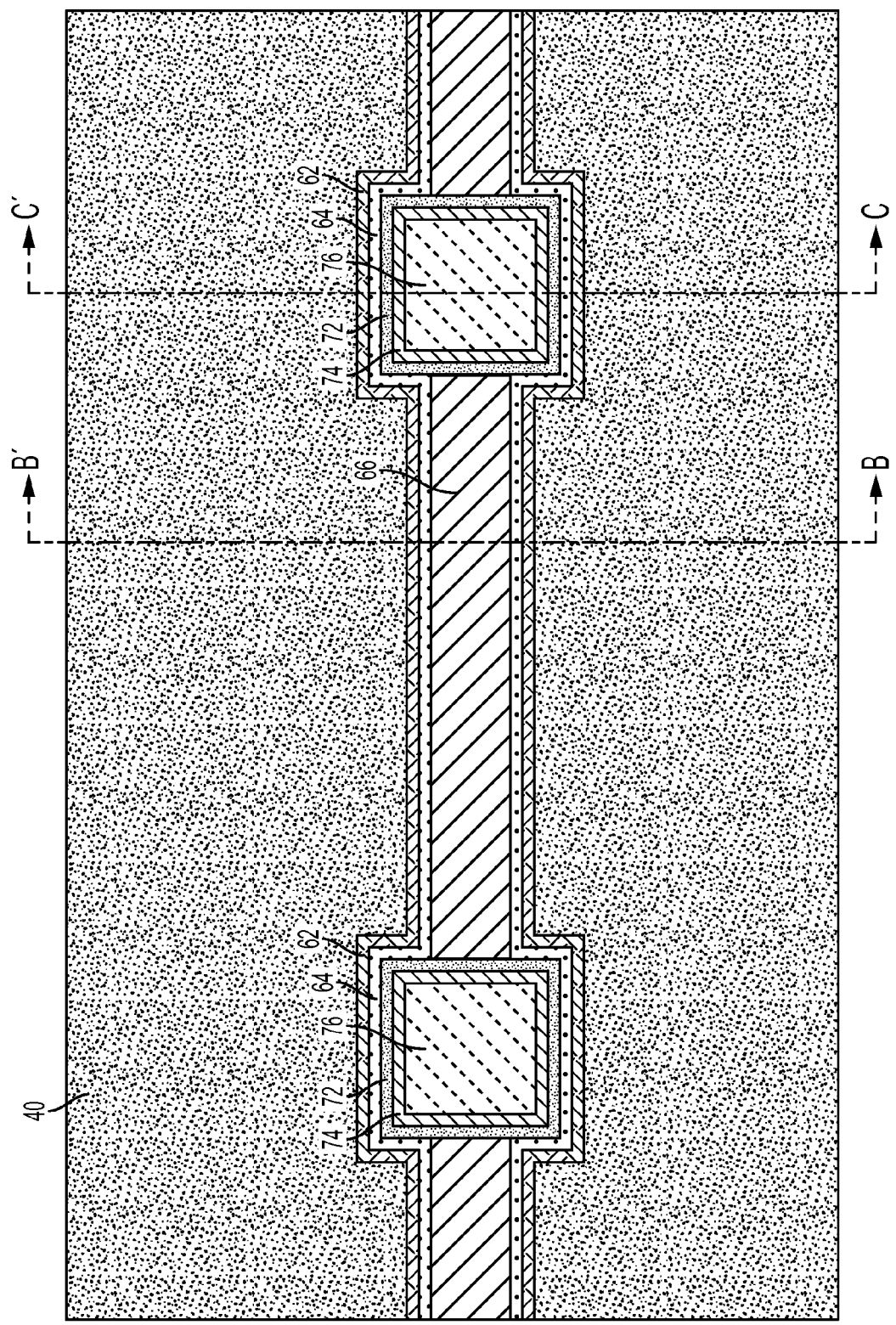
FIG. 6A is a top view of the first exemplary semiconductor structure of FIGS. 5A-5C after removing portions of the second conductive material, the second liner layer, the second diffusion barrier layer, the first conductive material layer, the first liner layer and the first diffusion barrier layer from the top surface of the dielectric hard mask layer.
Figure 6B:
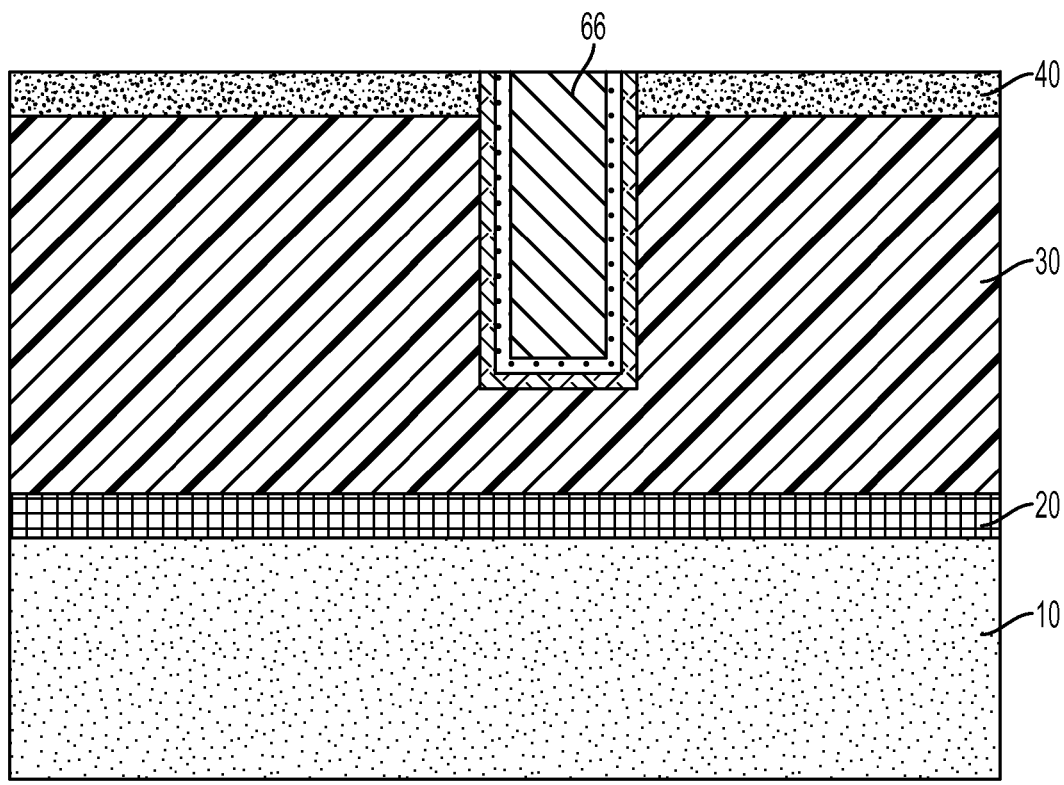
FIG. 6B is a cross-sectional view of the first exemplary semiconductor structure of FIG. 6A along line B-B'.
Figure 6C:
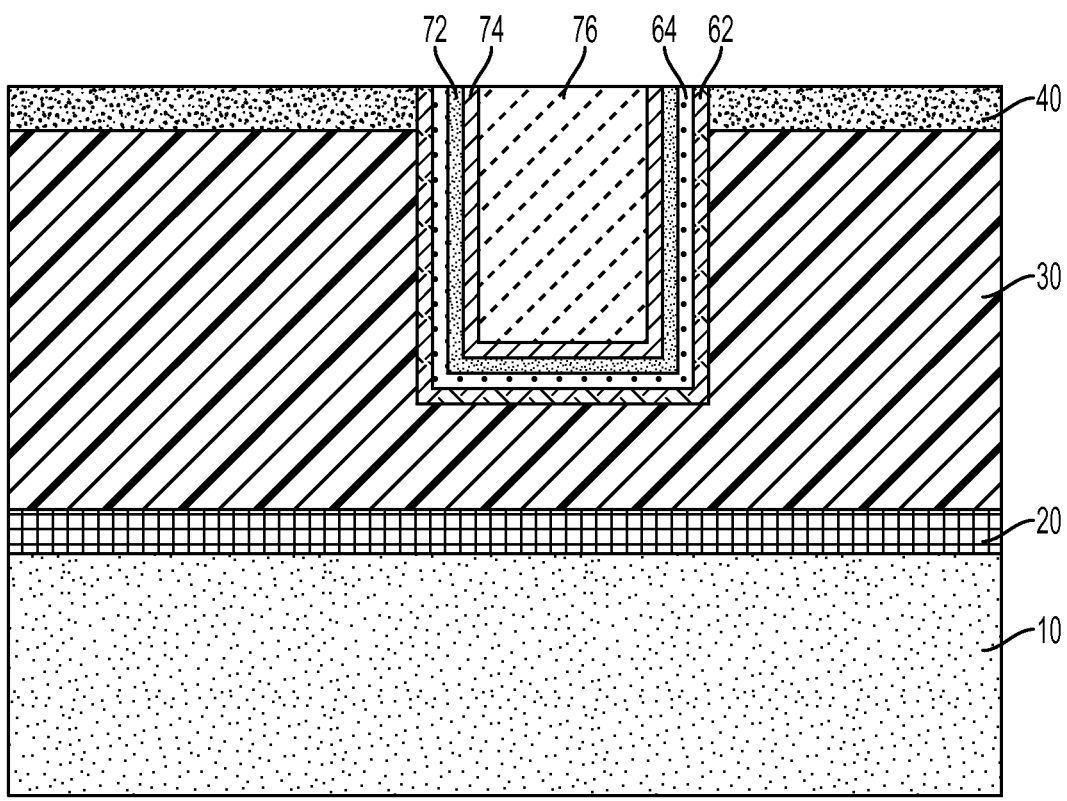
FIG. 6C is a cross-sectional view of the first exemplary semiconductor structure of FIG. 6A along line C-C'.

Referring to FIGS. 6A-6C, portions of the second conductive material layer 76L, the second liner layer 74L, the second diffusion barrier layer 72L, the first liner layer 64L, the first diffusion barrier layer 62L, and the first conductive material layer 66L that are located above the top surface of the dielectric hard mask layer 40 are removed employing a planarization process such as, for example, CMP. The remaining portion of the first diffusion barrier layer 62L constitutes a first diffusion barrier 62. The remaining portion of the first liner layer 64L constitutes a first liner 64. The remaining portion of the first conductive material layer 66L within each narrow trench portion 52A of the trench opening 52 constitutes a first conductive material 66. The remaining portion of the second diffusion barrier layer 72L within each wide trench portion 52B constitutes a second diffusion barrier 72. The remaining portion of the second liner layer 74L within each wide trench portion 52B constitutes a second liner 74. The remaining portion of the second conductive material layer 76L within each wide trench portion 52B constitutes a second conductive material portion 76. The first diffusion barrier 62, the first liner 64 and the first conductive material portions 66 together defines an interconnect structure. The second diffusion barrier 72, the second liner 74 and the second conductive material portion 76 located within each widen trench portion 52A together defines an electromigration blocking island.

In the present application, the electromigration blocking islands (72, 74, 76) divide the interconnect structure (62, 64, 66) into a plurality of interconnect segments each having a length equal to, or less than, the Blech length, thus ensuring electromigration resistance. Portions of the second diffusion barrier 72 and the second liner 74 located between adjacent first conductive material portions 66 and the second conductive material portions 76 act as diffusion blocking boundaries to impede long rage metal atom migration in the interconnect structure (62, 64, 66). The reliability of the ICs can thus be improved. The interconnect structure (62, 64, 66) is considered immortal because the interconnect structure (62, 64, 66) will not experience electromigration failure due to the presence of the electromigration blocking islands (72, 74, 76).

Moreover, because the electromigration blocking islands (72, 74, 76) of the present application are formed by taking advantage of the metal reflow process which preferentially fills those narrow trench portions having smaller dimensions first, no additional lithographic and etching processes are needed to create such electromigration blocking islands (72, 74, 76) in the interconnect structure (62, 64, 66). The manufacturing time and cost can thus be reduced.

Figure 7A:
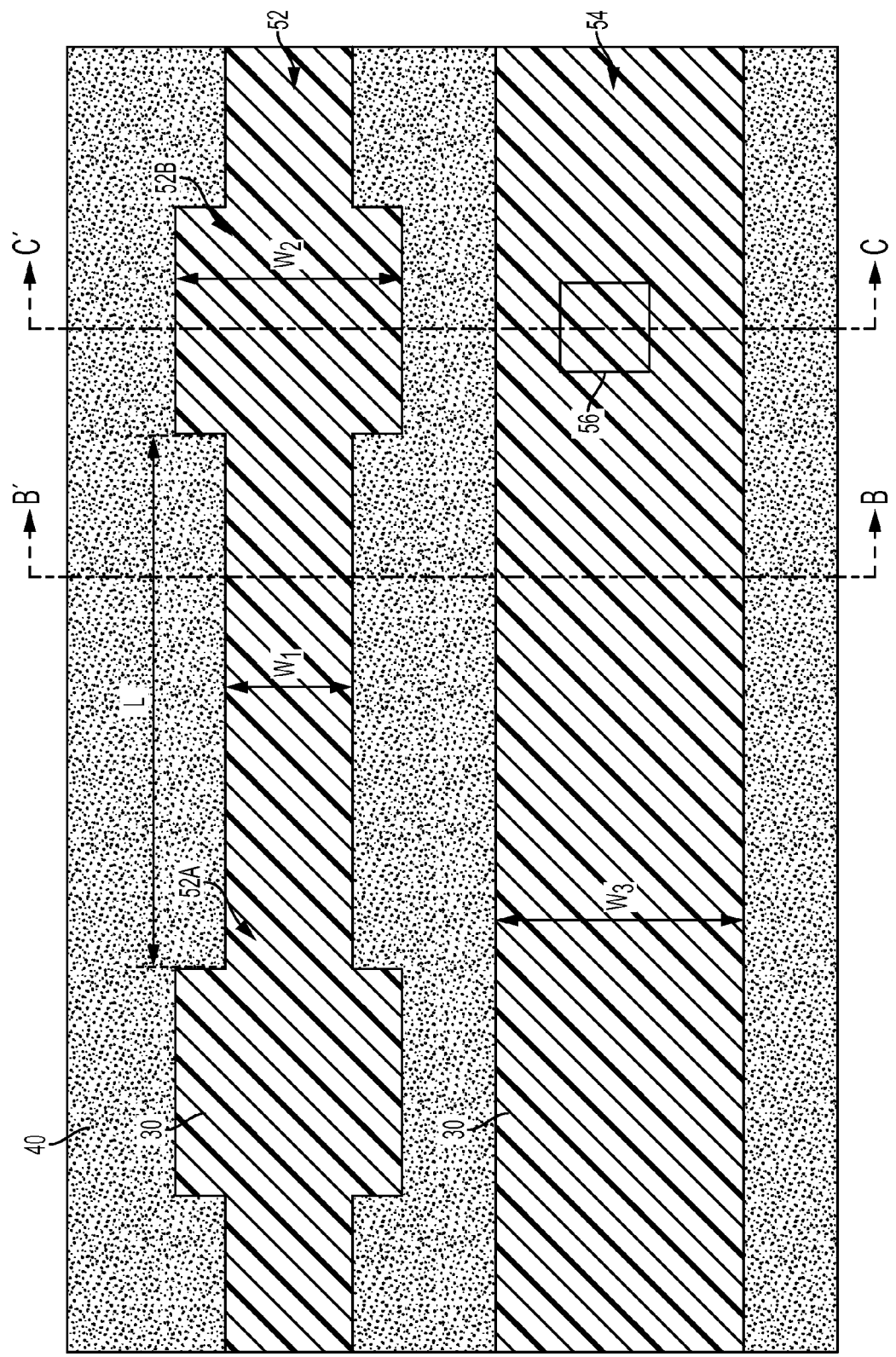
FIG. 7A is a top view of a second exemplary semiconductor structure after forming a first trench opening, a second trench opening and a via opening within a material stack located on a substrate according to a second embodiment of present application. The first trench opening includes narrow trench portions spaced apart by at least one wide trench portion. The second trench opening overlies and intersects the via opening that exposes a portion of the substrate.
Figure 7B:
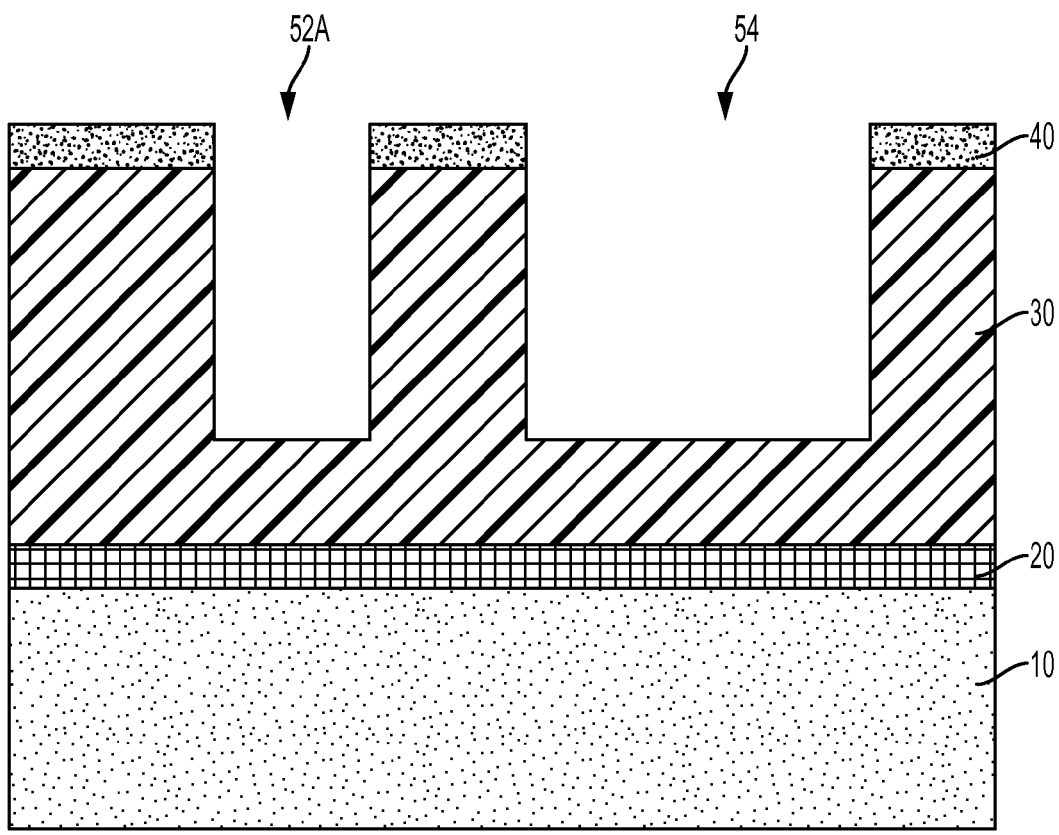
FIG. 7B is a cross-sectional view of the second exemplary semiconductor structure of FIG. 7A along line B-B'.
Figure 7C:
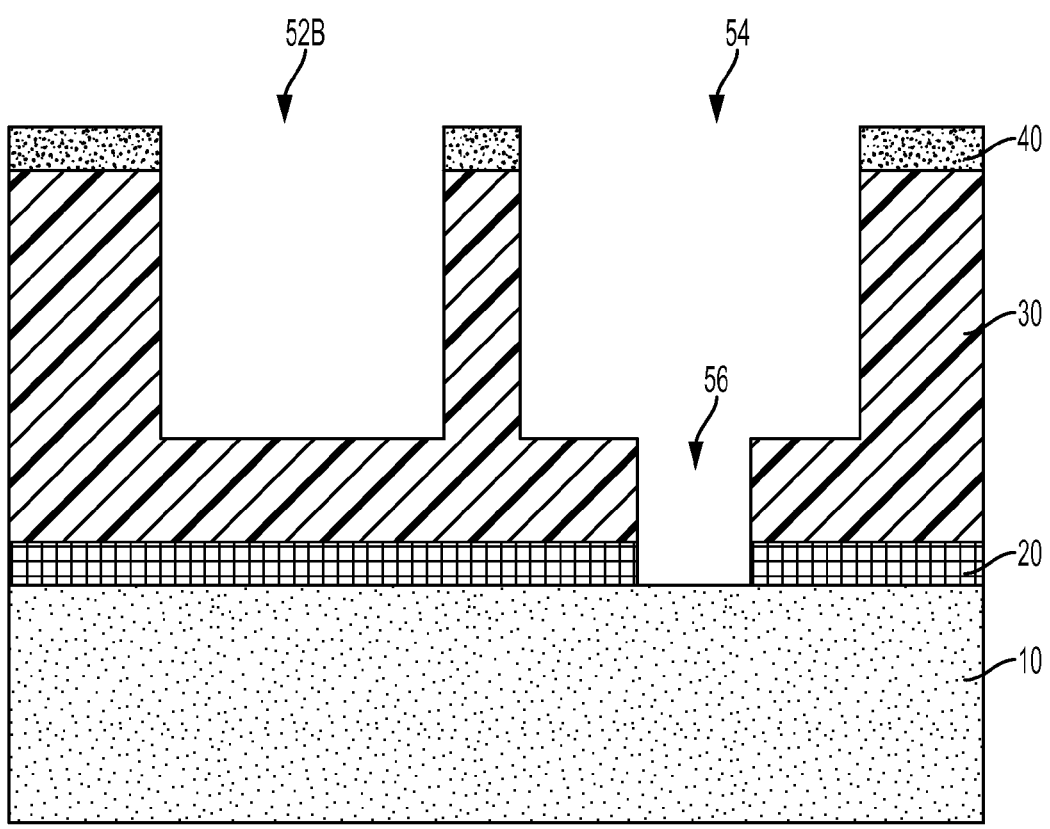
FIG. 7C is a cross-sectional view of the second exemplary semiconductor structure of FIG. 7A along line C-C'.

Referring to FIGS. 7A-7C, a second exemplary semiconductor structure of the present application according to a second embodiment of the present application includes a first trench opening 52, a second trench opening 54 and a via opening 56 underlying and intersecting the second trench opening 54 formed in the material stack of FIGS. 1A-1C.

The first trench opening 52 includes narrow trench portions 52A and at least one wide trench portion 52B the same as those described in FIGS. 1A-1C. The second trench opening 54 is a long undivided trench having a uniform third width $W_3$ throughout its entire length. The third width $W_3$ is greater than a critical width at which the electromigration of the interconnect metal may occur. In one embodiment, the third width $W_3$ is set to be at least three times of the first width $W_1$ of the narrow trench portions 52A. The via opening 56 extends through the dielectric cap layer 20 to expose a portion of the substrate 10.

The first trench opening 52, the second trench opening 54, and via opening 56 can be formed by any conventional dual damascene processing. In one embodiment, a trench first dual damascene process may be employed where a first lithographic patterning process is carried out to pattern and etch the trench openings 52, 54 part way through the thickness of the dielectric material layer 30, followed by a second lithographic patterning process to pattern and etch the via opening 56 inside the second trench opening 54 the rest of the way through the dielectric material layer 30 and through the dielectric cap layer 20, if present. The via opening 56 intersects the second trench opening 54.

Figure 8A:
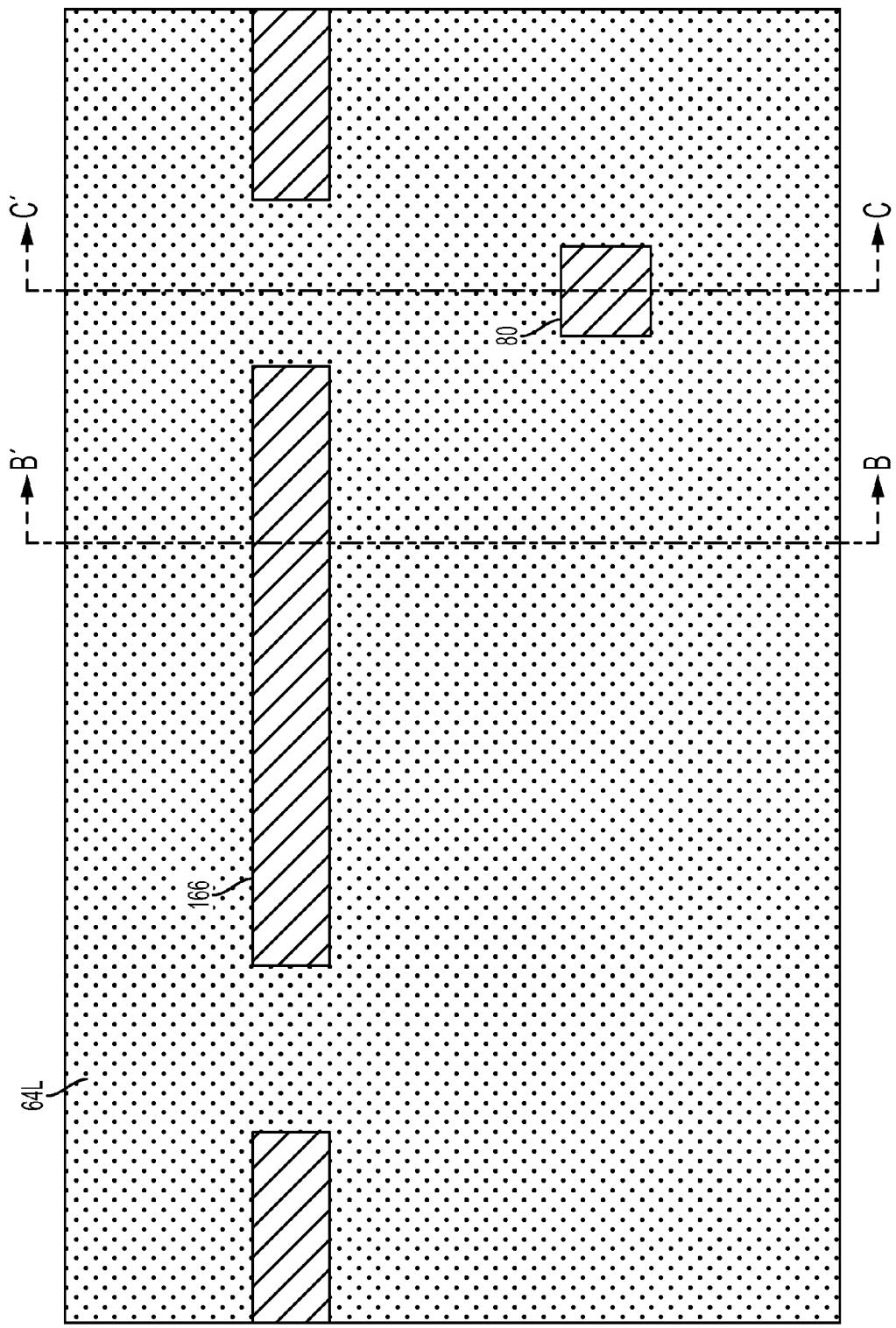
FIG. 8A is a top view of the second exemplary semiconductor structure of FIGS. 7A-7C after forming a stack of, from bottom to top, a first diffusion barrier layer and a first liner layer over sidewalls and bottom surfaces of the first trench opening, the second trench openings and the via opening, and a top surface of a dielectric hard mask layer in the material stack followed by forming a first conductive material layer to fill the narrow trench portions of the first trench opening and the via opening.
Figure 8B:
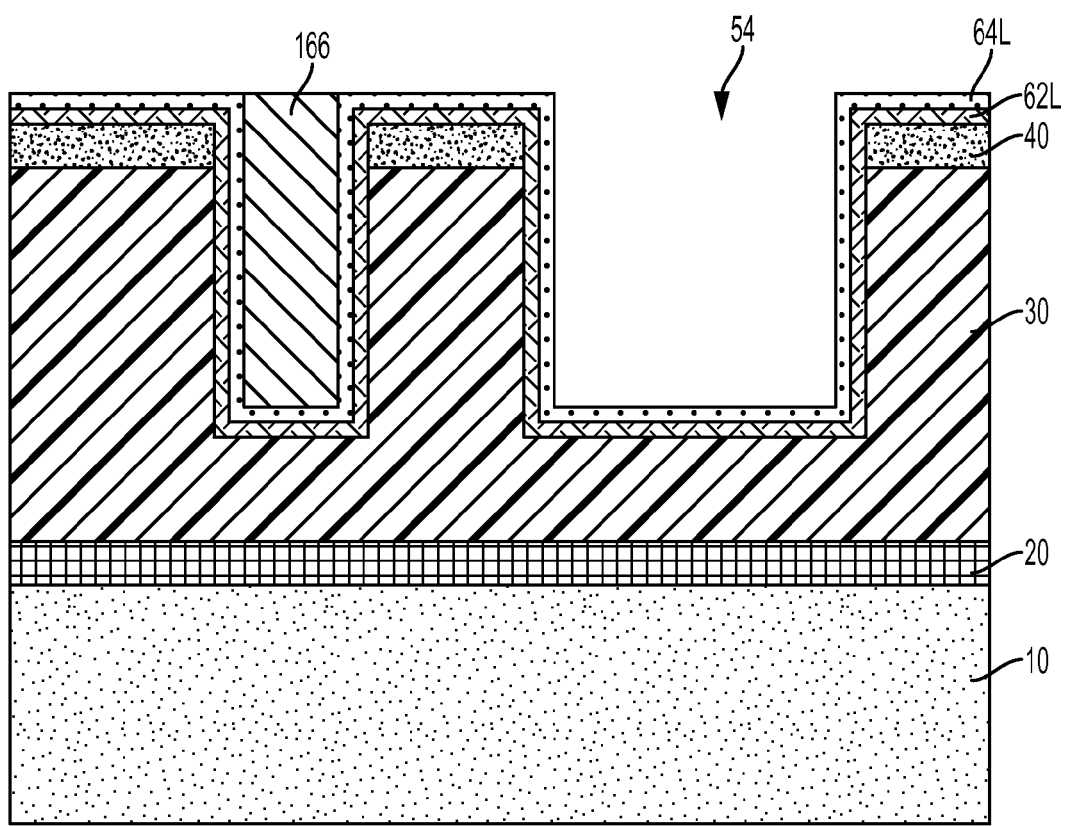
FIG. 8B is a cross-sectional view of the second exemplary semiconductor structure of FIG. 8A along line B-B'.
Figure 8C:
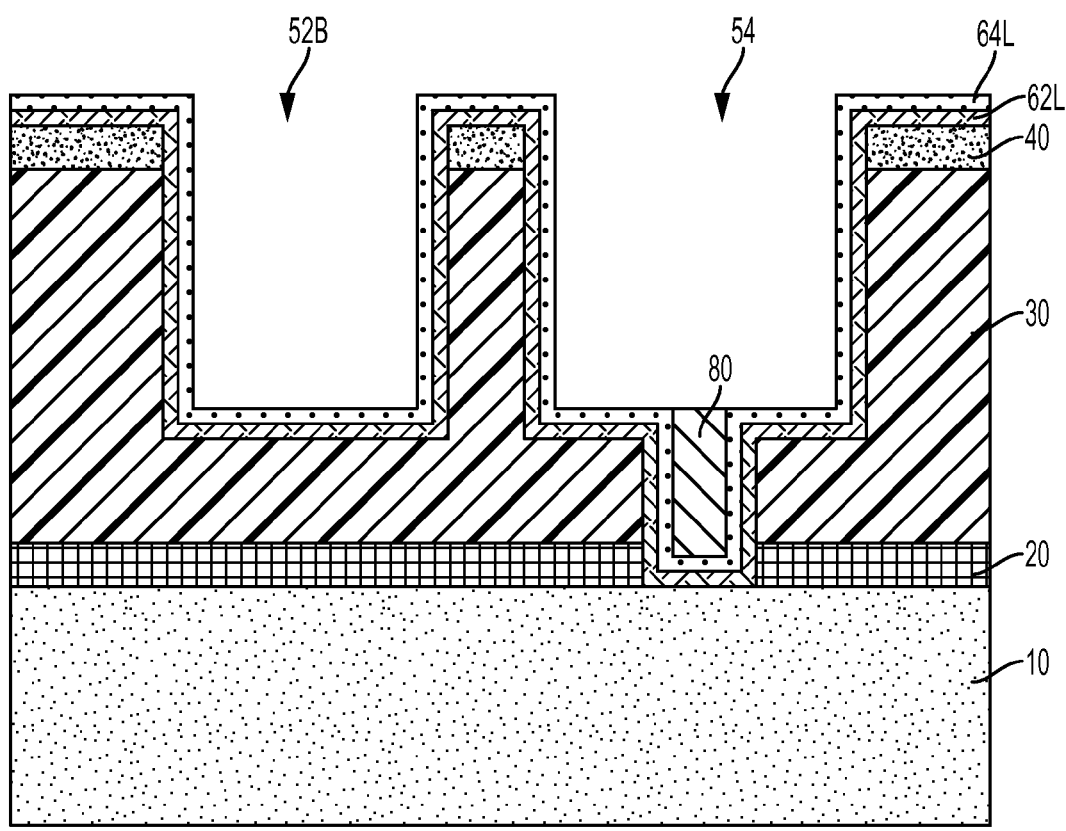
FIG. 8C is a cross-sectional view of the second exemplary semiconductor structure of FIG. 8A along line C-C'.

Referring to FIGS. 8A-8C, processing steps of FIGS. 2A-2C are performed to form a first diffusion barrier layer 62L on sidewalls and bottom surfaces of the trench openings 52, 54 and the via opening 56, and to form a first liner layer 64L over the first diffusion barrier layer 62L. Subsequently, processing steps of FIGS. 3A-3B are performed to fill the narrow trench portions 52A of the first trench opening 52 and the via opening 56 with a first conductive material layer, while relatively wider openings including the wide trench portions 52B of the first trench opening 52 and the second trench opening 54 are left unfilled. Portions of the first conductive material layer that are located within the narrow trench portions 52A constitute first conductive material layer portions 166. A portion of the first conductive material layer that are located within the via opening 56 constitute a via fill portion 80.

Figure 9A:
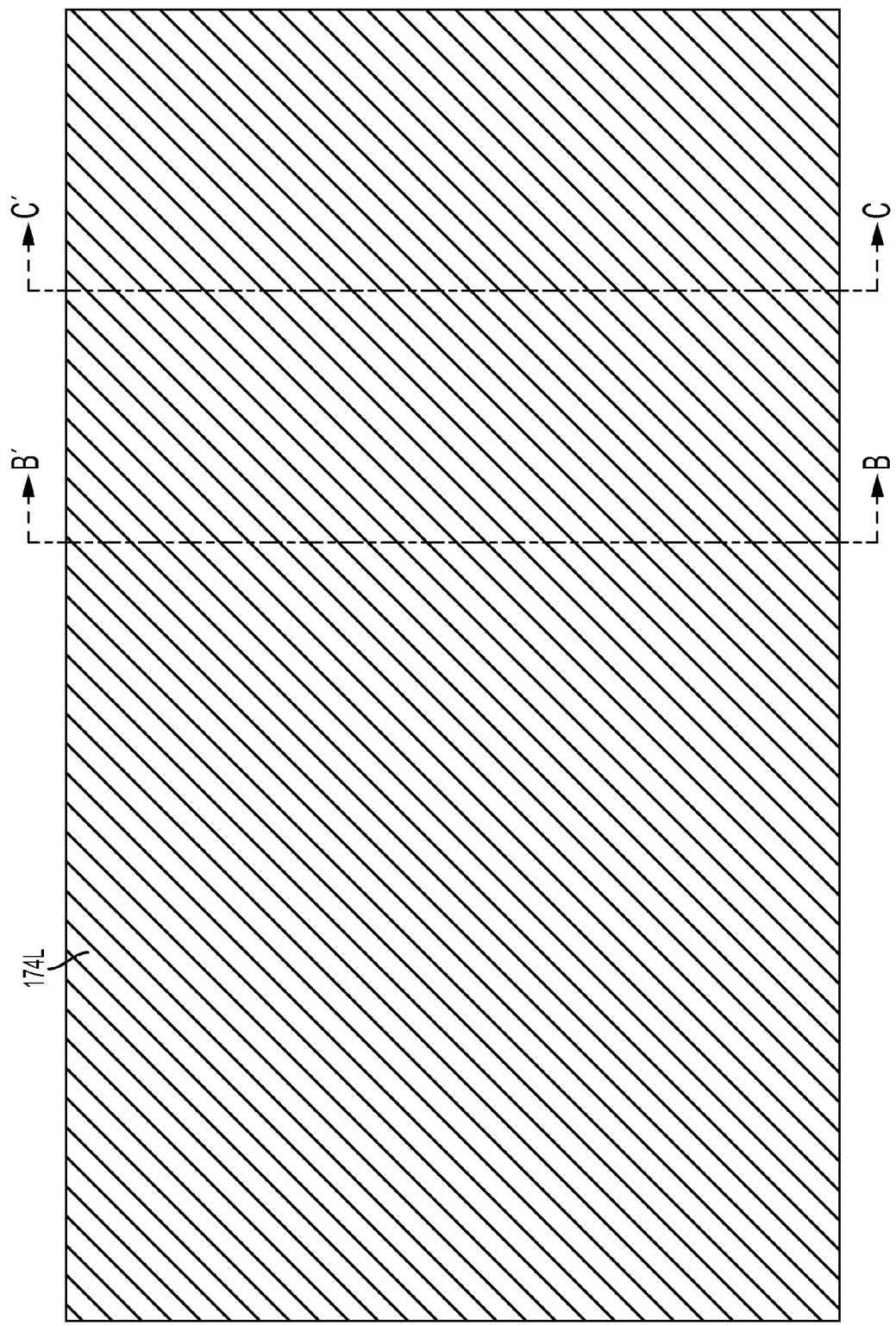
FIG. 9A is a top view of the second exemplary semiconductor structure of FIGS. 8A-8C after forming a stack of, from bottom to top, a second diffusion barrier layer and a second liner layer over the first liner layer and the first conductive material layer.
Figure 9B:
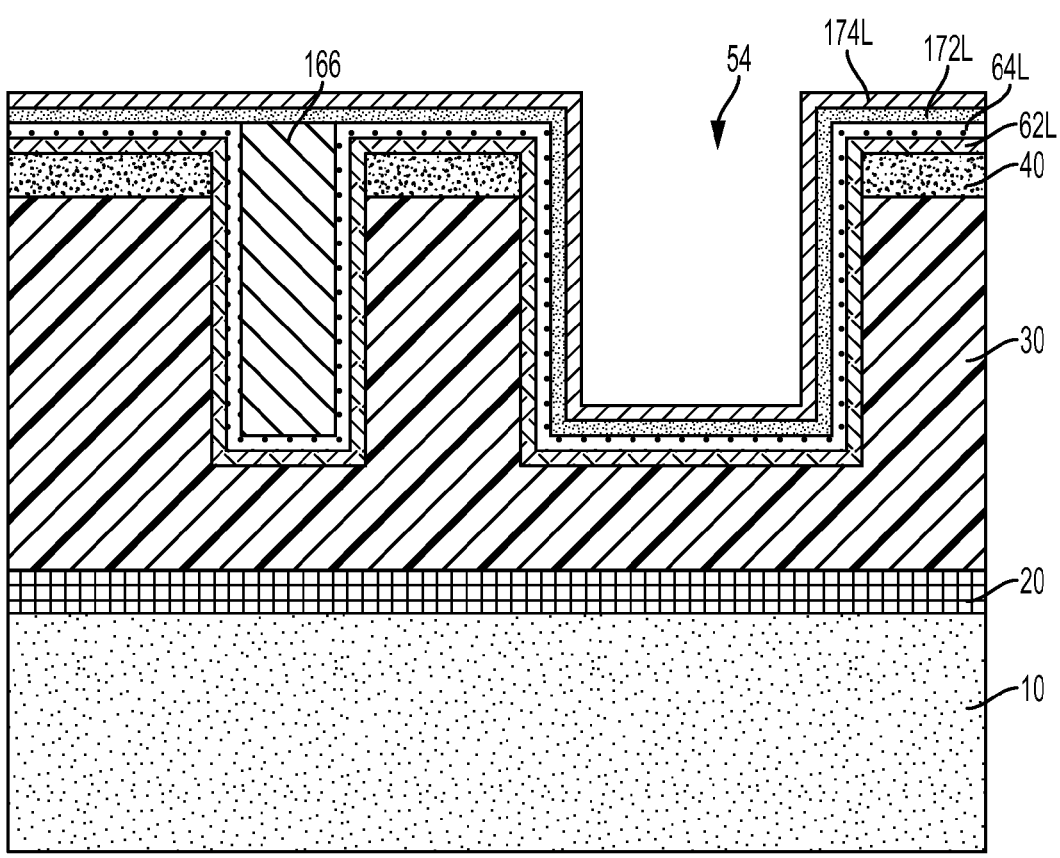
FIG. 9B is a cross-sectional view of the second exemplary semiconductor structure of FIG. 9A along line B-B'.
Figure 9C:
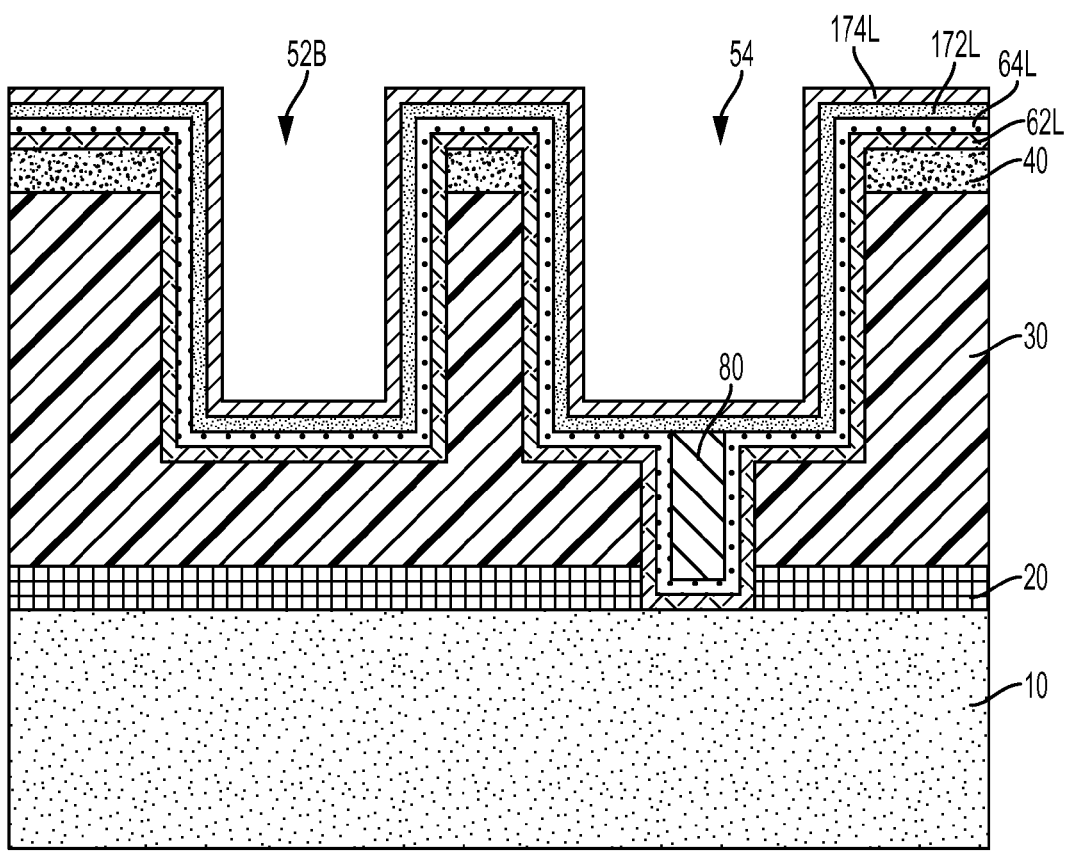
FIG. 9C is a cross-sectional view of the second exemplary semiconductor structure of FIG. 9A along line C-C'.

Referring to FIGS. 9A-9B, processing steps of FIGS. 4A-4B are performed to form a second diffusion barrier layer 172L over the first liner layer 64L, the first conductive material layer portions 116 and the via fill portion 80, followed by forming a second liner layer 174L over the second diffusion barrier layer 172L.

Figure 10A:
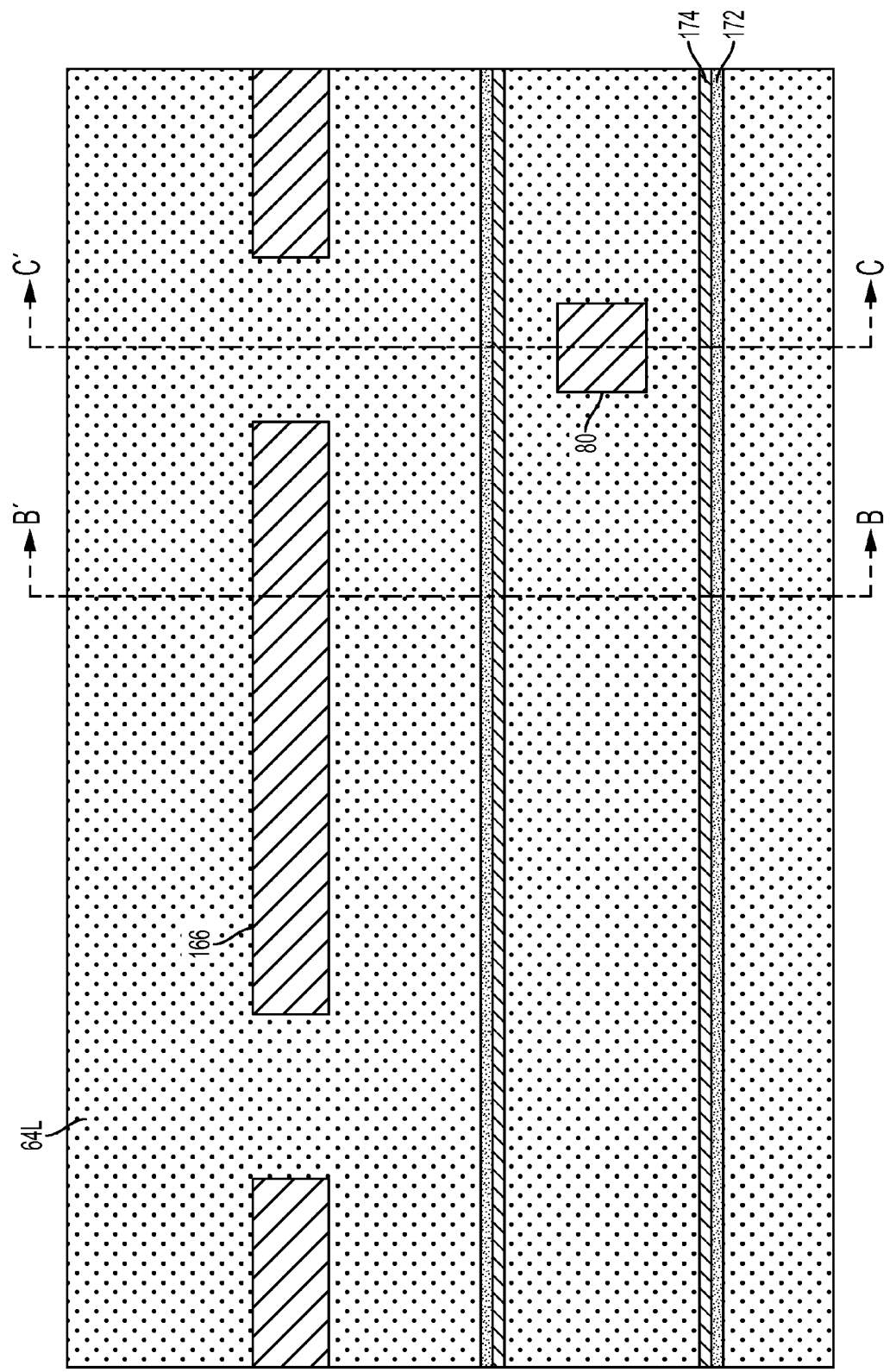
FIG. 10A is a top view of the second exemplary semiconductor structure of FIGS. 9A-9C after removing horizontal portions of the second diffusion barrier layer and the second liner layer.
Figure 10B:
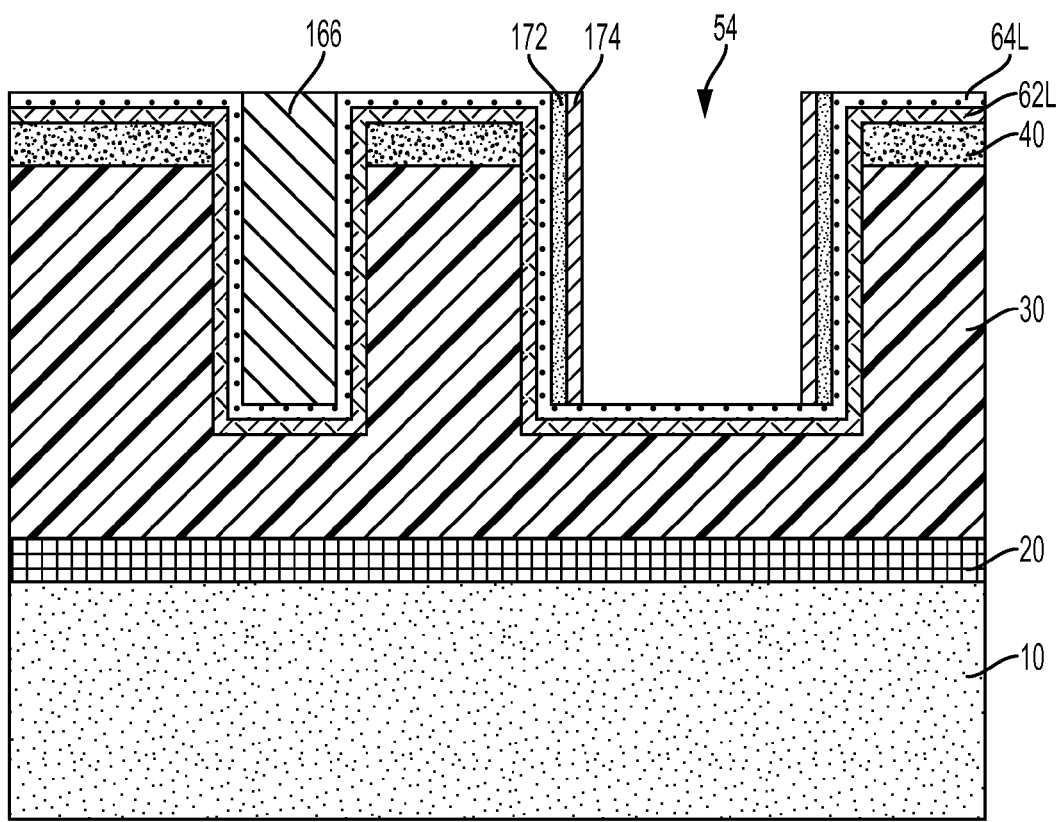
FIG. 10B is a cross-sectional view of the second exemplary semiconductor structure of FIG. 10A along line B-B'.
Figure 10C:
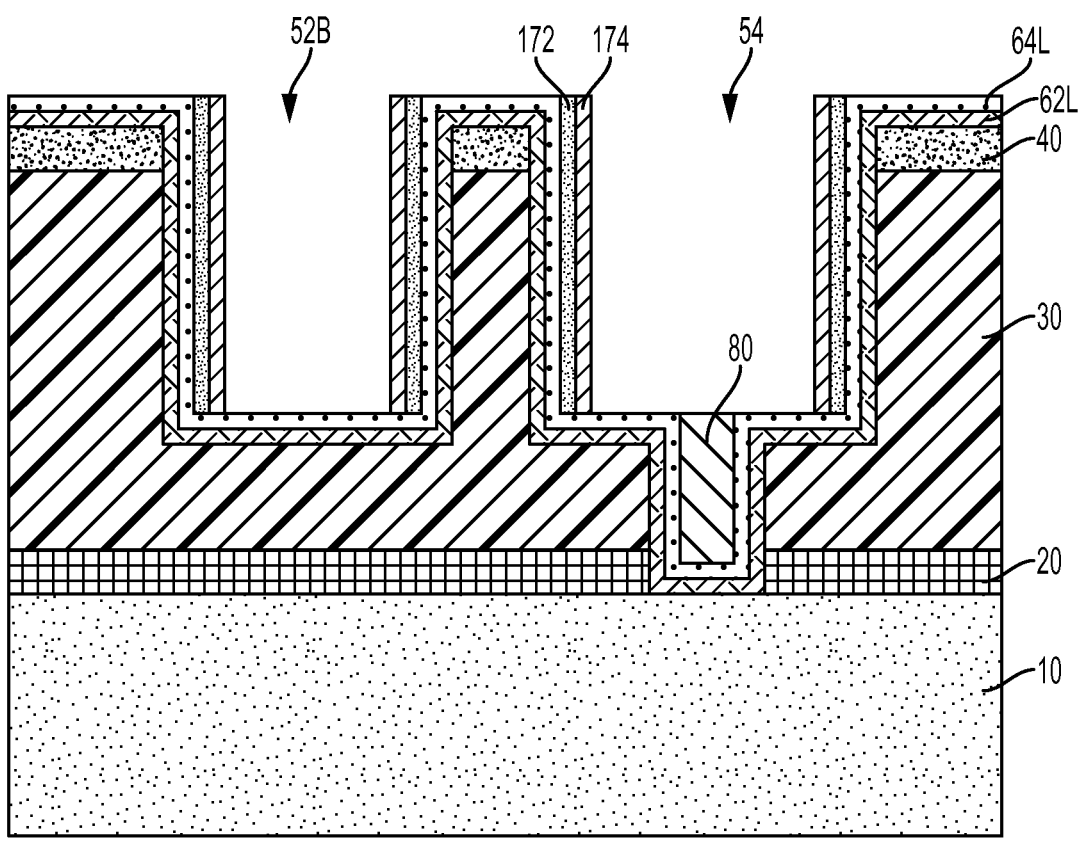
FIG. 10C is a cross-sectional view of the second exemplary semiconductor structure of FIG. 10A along line C-C'.

Referring to FIGS. 10A-10C, horizontal portions of the second diffusion barrier layer 172L and the second liner layer 174L are removed from the topmost surface of the first liner layer 64L and the bottom surfaces of the first and the second trench openings 52, 54 by an anisotropic etch. The anisotropic etch can be a dry etch such as, for example, RIE or a wet chemical wet that removes the materials of the second diffusion barrier layer 172L and the second liner layer 174L selective to the materials of the first liner layer 64L and the first conductive material layer. Vertical portions of the second diffusion barrier layer 172L that remain on sidewalls of the first and second trench openings 52, 54 are herein referred to as second diffusion barrier layer portions 172. Vertical portions of the second liner layer 174L that remain on sidewalls of the first and second trench openings 52, 54 are herein referred to as second liner layer portions 174. The via fill portion 80 is thus exposed at the bottom of each second trench opening 54.

Removal of the second diffusional barrier layer 172L and the second line layer 174L from the top of the via fill portion 80 reduces the line resistance resulted from the introduction of a second set of the diffusion barrier and liner in the interconnect structure.

Figure 11A:
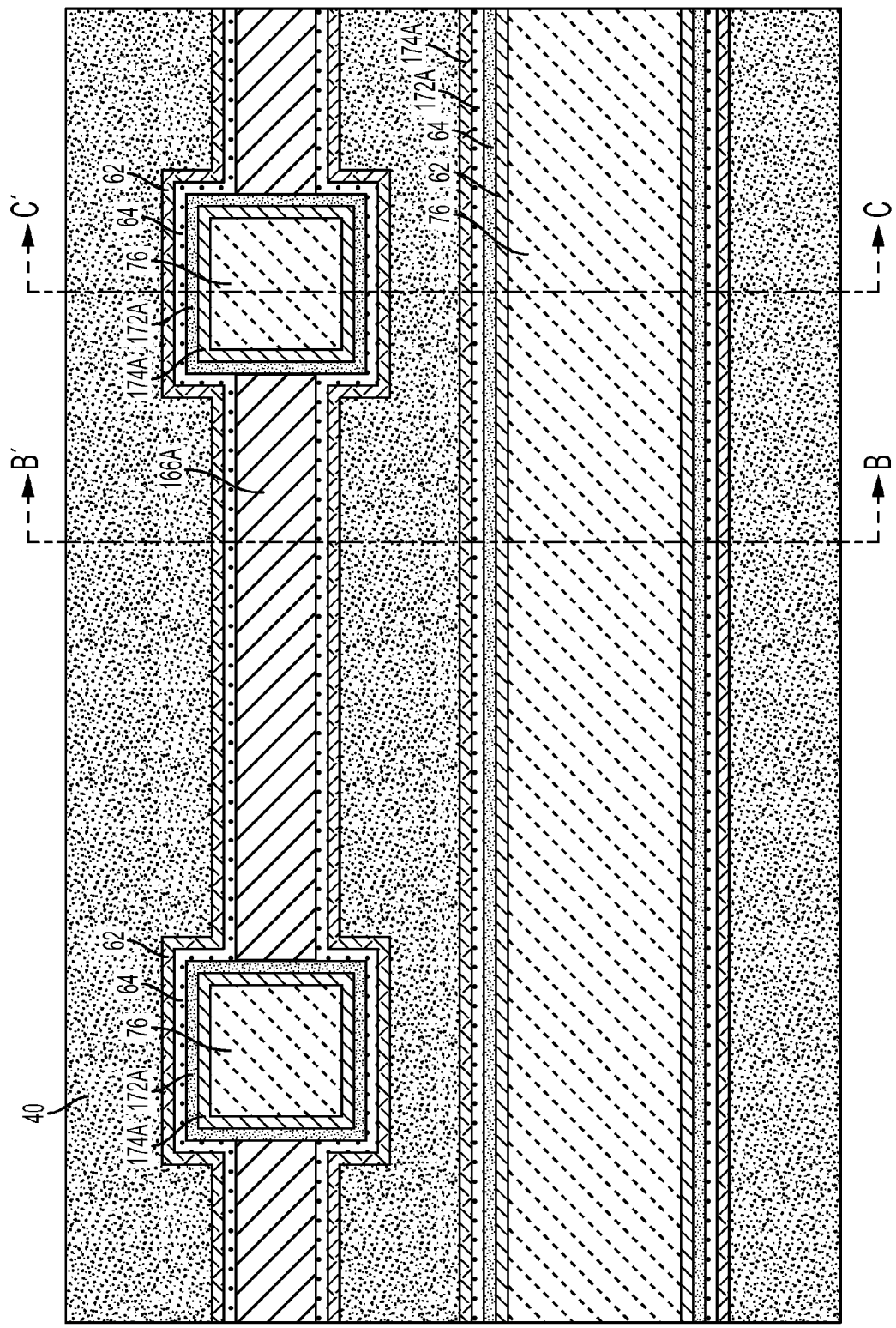
FIG. 11A is a top view of the second exemplary semiconductor structure of FIGS. 10A-9C after depositing a second conductive material layer in the wide trench portions of the first trench opening and the second trench opening and removing portions of the second conductive material, the second liner layer, the second diffusion barrier layer, the first conductive material layer, the first liner layer and the first diffusion barrier layer from the top surface of the dielectric hard mask layer.
Figure 11B:
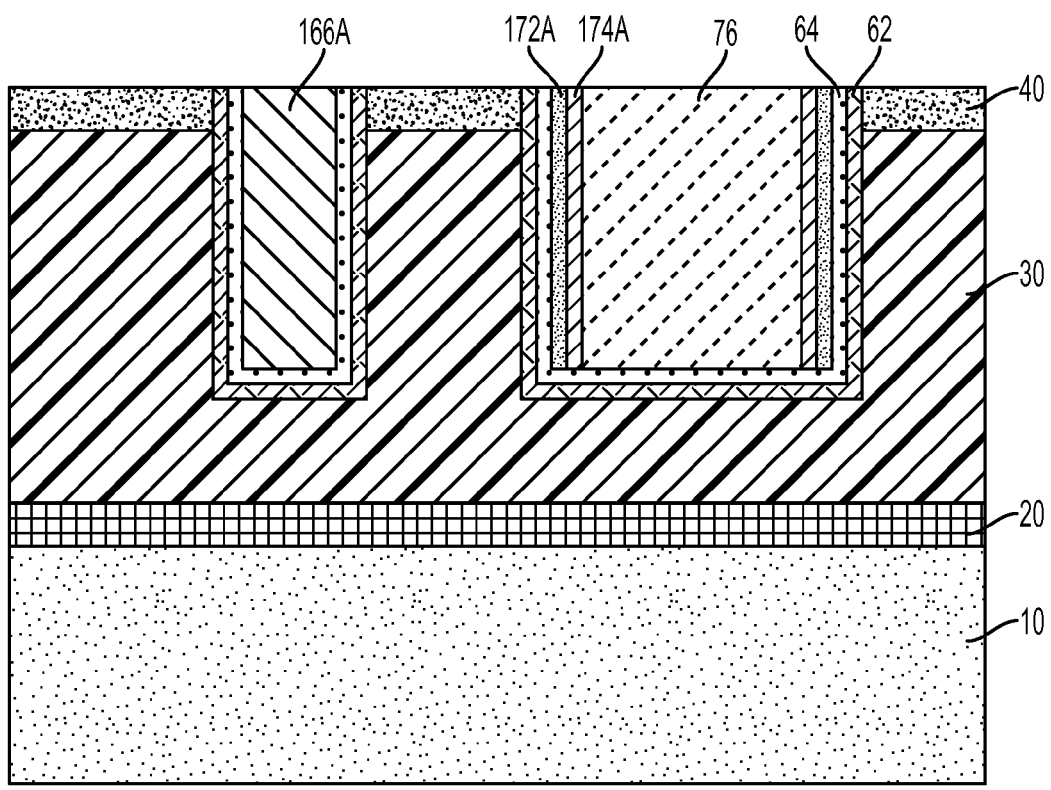
FIG. 11B is a cross-sectional view of the second exemplary semiconductor structure of FIG. 11A along line B-B'.
Figure 11C:
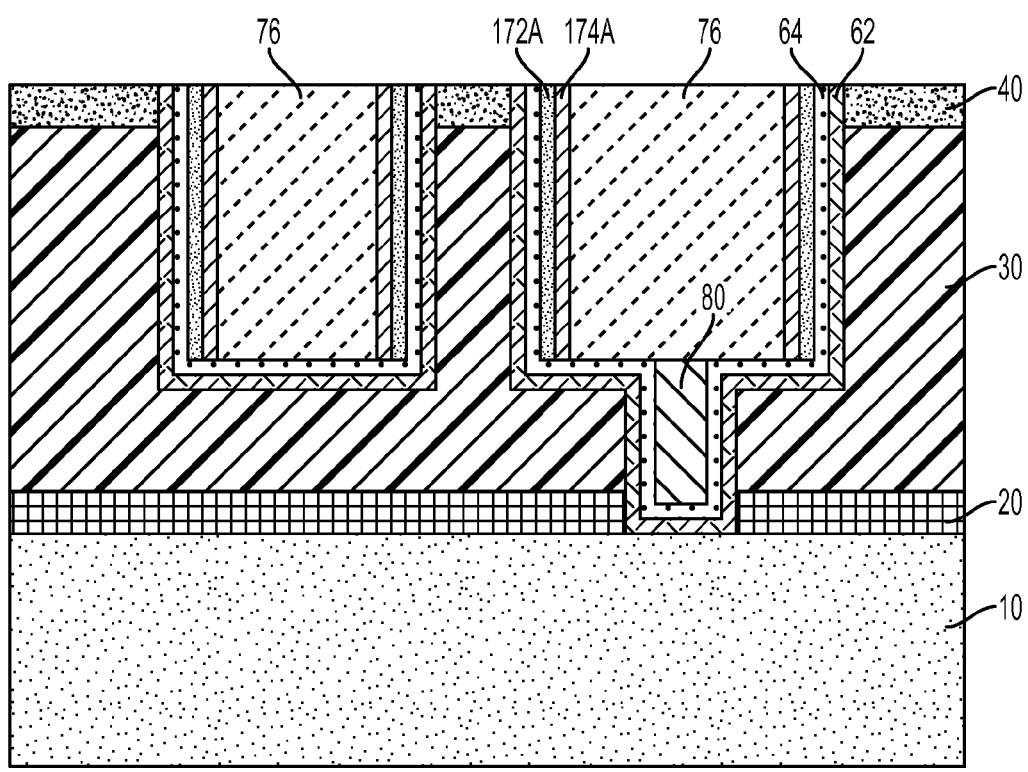
FIG. 11C is a cross-sectional view of the second exemplary semiconductor structure of FIG. 11A along line C-C'.

Referring to FIGS. 11A-11C, a second conductive material layer (not shown) is deposited to fill the remaining spaces of the first and the second trench openings 52, 54 by performing processing steps of FIGS. 5A-5C. Subsequently, portions of the second conductive material layer, the second liner layer portions 174, the second diffusion barrier layer portions 172, the first liner layer 64L, the first diffusion barrier layer 62L and the first conductive material layer portions 166 that are located above the top surface of the dielectric hard mask layer 40 are removed by, for example, CMP. The remaining portions of the first diffusion barrier layer 62L within the first trench opening 52, the second trench opening 54 and the via opening 56 constitute first diffusion barriers 62. The remaining portions of the first liner layer 64L within the first trench opening 52, the second trench opening 54 and the via opening 56 constitute first liners 64. The remaining portions of the first conductive material layer portion 166 within the narrow trench portion 52A of the first trench opening 52 constitute first conductive material portions 166A. The remaining portions of the second diffusion barrier layer portions 172 within the wide trench portions 52B of the first trench opening 52 and the second trench opening 54 constitutes second diffusion barriers 172A. The remaining portions of the second liner layer portions 174 within wide trench portions 52B of the first trench opening 52 and the second trench opening 54 constitute second liners 174A. The remaining portions of the second conductive material layer 76L within the wide trench portions 52B of the first trench opening 52 and the second trench opening 54 constitute second conductive material portions 76.

The first diffusion barrier 62, the first liner 64, and the first conductive material portions 166A located within the narrow trench portions 52B of the first trench opening 52 together define a first interconnect structure. The second diffusion barrier 72, the second liner 174 and the second conductive material portion 76 located with each wide trench portion 52A of the first trench opening 52 together defines an electromigration blocking islands. The first diffusion barrier 62, the first liner 64, the second diffusion barrier 72, the second liner 74 and the second conductive material portion 76 located within the second trench opening 54 together defines a second interconnect structure. The first diffusion barrier 62, the first liner 64 and the via fill portion 80 together define a via structure that electrically connects the second interconnect structure (62, 64, 72, 74, 76) to a conductive feature in the substrate 10.

Figure 12:
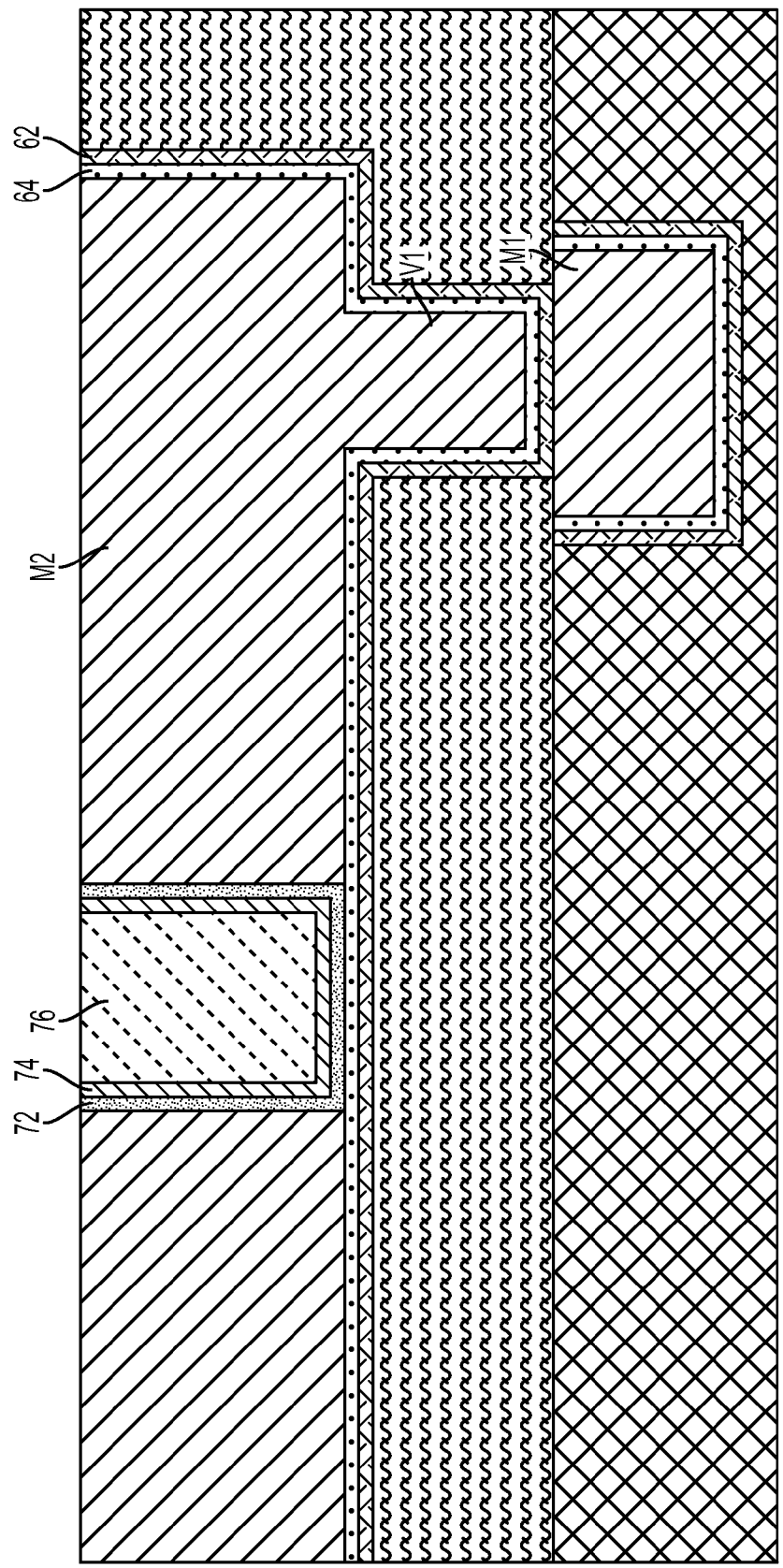
FIG. 12 a cross-sectional view of a first exemplary multi-level interconnect structure that can be derived from the first exemplary semiconductor structure of the present application.

FIG. 12 illustrates a first exemplary multilevel interconnect structure that can be derived from the first exemplary semiconductor structure of the present application. In one embodiment and as shown in FIG. 12, a first metal line M1 (i.e., first interconnect structure) is electrically connected to a second metal line M2 ((i.e., second interconnect structure) by a via structure V1. An electromigration blocking island (72, 74, 76) is created in the second metal line M2 to impede the electromigration of the metal atoms.

Figure 13:
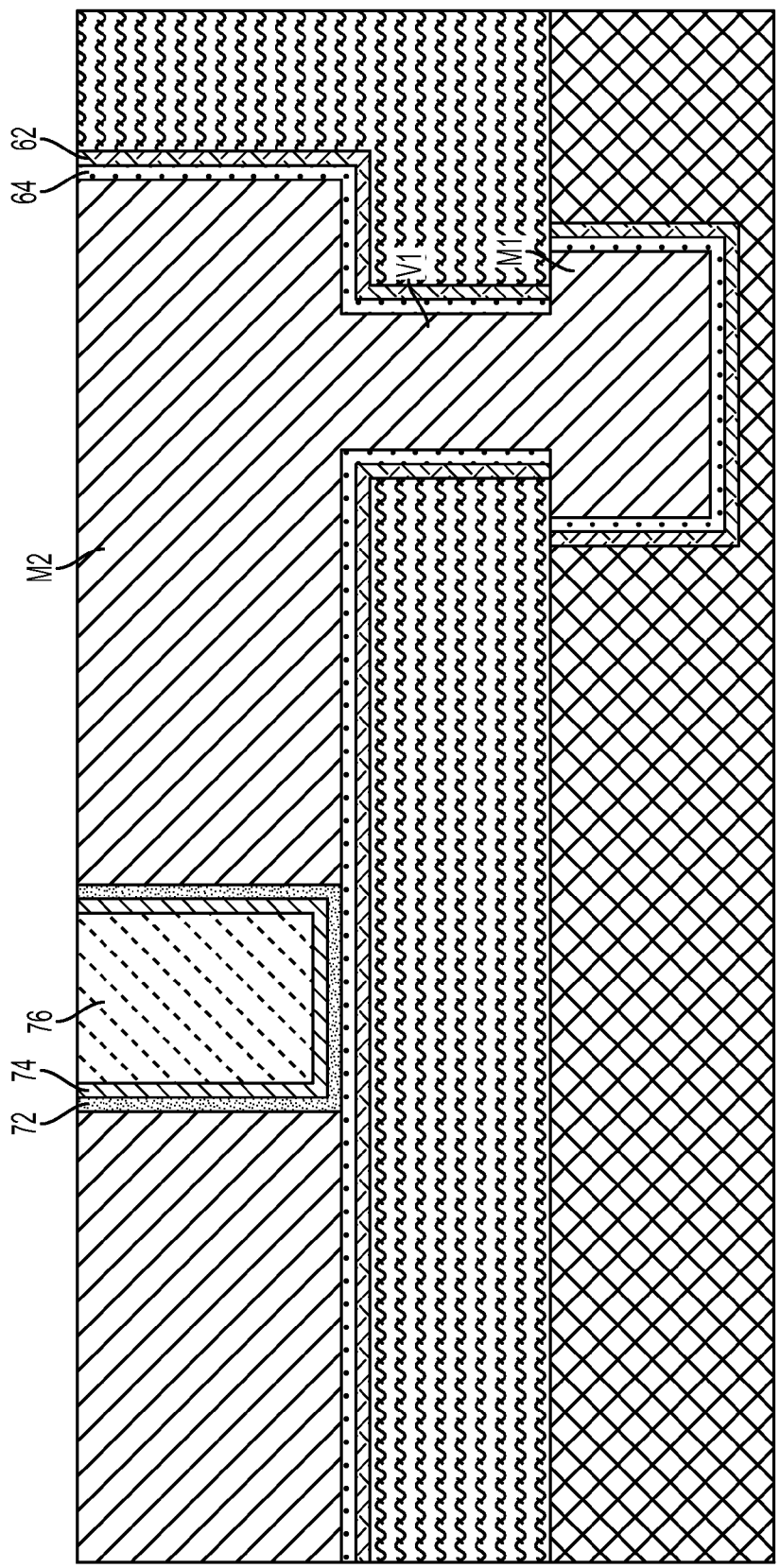
FIG. 13 is a cross-sectional view of a variation of the first exemplary multilevel interconnect structure.

FIG. 13 illustrates a variation of the first exemplary multilevel interconnect structure. In FIG. 13, portions of the first diffusion barrier 62 and the first liner 64 are removed from the bottom of the via structure V1 to reduce the via resistance.

Figure 14:
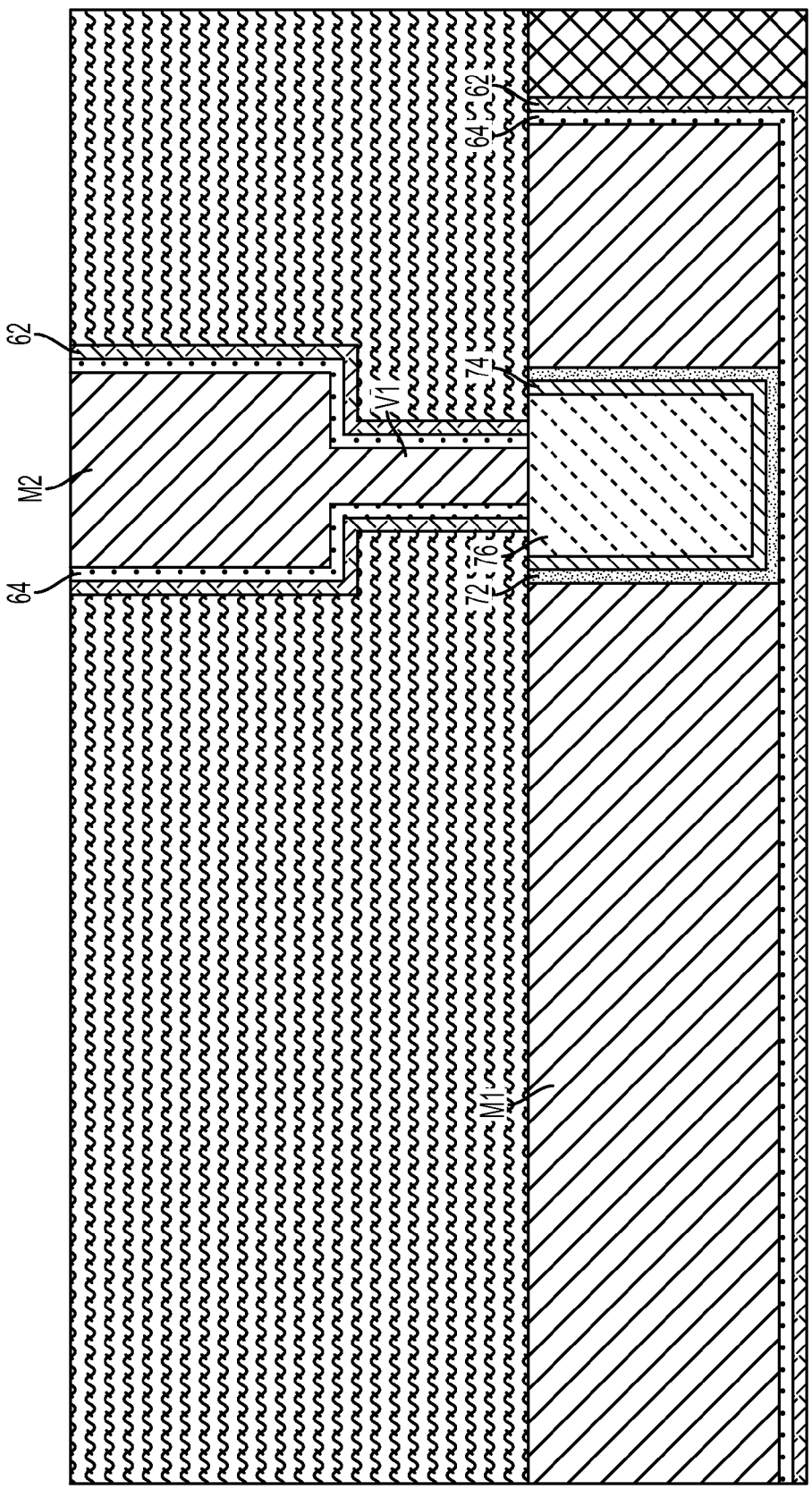
FIG. 14 is a cross-sectional view of a second exemplary multilevel interconnect structure that can be derived from the first exemplary semiconductor structure of the present application.

FIG. 14 illustrates a second exemplary multilevel interconnect structure that can be derived from the first exemplary semiconductor structure of the present application. In FIG. 14, a first metal line M1 is electrically connected to a second metal line M2 by a via structure V1. The via structure V1 is landed directly on an electromigration blocking island (72, 74, 76) that is created in the first metal line M1. The electromigration blocking islands (72, 74, 76) acts as blocking boundaries to impede the electromigration of the metal atoms through via bottom junction or along M1 or M2 metal lines in the vicinity of the blocking islands (72, 74, 76).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure, comprising:
a trench opening located within a dielectric material layer present on a substrate, the trench opening comprising a plurality of first trench portions having a first width and at least one second trench portion having a second width greater than the first width, the at least one second trench portion separating the plurality of first trench portions from each other;
a first diffusion barrier present on sidewalls and a bottom surface of the trench opening;
a first liner present on the first diffusion barrier;
first conductive material portions present on portions of the first liner located within the plurality of first trench portions, each first conductive material portion filling a remaining space of each of the plurality of first trench portions; and
an electromigration blocking island located within the at least one second trench portion and abutting respective ends of adjacent first conductive material portions, the electromigration blocking island comprising a second diffusion barrier present on portions of the first liner located in the at least one second trench portion and the respective ends of the adjacent first conductive material portions, a second liner present on the second diffusion barrier, and a second conductive material portion present on the second liner and filling a remaining space of the at least one second trench portion.

2. The interconnect structure of claim 1, wherein each of the plurality of first trench portions has a length equal to or less than a Blech length.

3. The interconnect structure of claim 2, wherein the length of each of the plurality of first trench portions is from 2 µm to 6 µm.

4. The interconnect structure of claim 1, wherein each of the first diffusion barrier and the second diffusion barrier comprises Ta, TaN, W, WN, Ti, TiN, Ta/TaN, Ta/TaN/Ta, or Ti/TiN.

5. The interconnect structure of claim 1, wherein each of the first liner and the second liner comprises Ru, Ir, Os, Rh, Re, Pd, Pt, Au, or alloys thereof.

6. The interconnect structure of claim 1, wherein the first width is from 18 nm to 26 nm, and the second width is from 20 nm to 30 nm.

7. The interconnect structure of claim 1, wherein each of the first conductive material portion and the second conductive material portion comprises Cu or Co.

8. The interconnect structure of claim 1, further comprising a dielectric hard mask layer present over the dielectric material layer, wherein the trench opening extends through the dielectric hard mask layer into the dielectric material layer.

9. The interconnect structure of claim 8, further comprising a dielectric cap layer located between the dielectric material layer and the substrate.

10. The interconnect structure of claim 1, wherein the interconnect structure is a first metal line that overlies a second metal line, wherein the first metal line is electrically connected to the second metal line by a via structure.

11. The interconnect structure of claim 1, wherein the interconnect structure is a first metal line that underlies a second metal line, wherein the first metal line is electrically connected to the second metal line by a via structure landed on the electromigration blocking island.

12. An interconnect structure, comprising:
a trench opening located within a dielectric material layer present on a substrate, the trench opening comprising a plurality of first trench portions having a first width and at least one second trench portion having a second width greater than the first width, the at least one second trench portion separating the plurality of first trench portions from each other;
a first diffusion barrier present on sidewalls and a bottom surface of the trench opening;
a first liner present on the first diffusion barrier;
first conductive material portions present on portions of the first liner located within the plurality of first trench portions, each first conductive material portion filling a remaining space of each of the plurality of first trench portions; and
an electromigration blocking island located within the at least one second trench portion and abutting respective ends of adjacent first conductive material portions, the electromigration blocking island comprising a second diffusion barrier present on vertical portions of the first liner located in the at least one second trench portion and the respective ends of the adjacent first conductive material portions, a second liner present on the second diffusion barrier, and a second conductive material portion present on the second liner and filling a remaining space of the at least one second trench portion.

13. The interconnect structure of claim 12, wherein each of the plurality of first trench portions has a length equal to or less than a Blech length.

14. The interconnect structure of claim 12, wherein the first width is from 18 nm to 26 nm, and the second width is from 20 nm to 30 nm.

15. A method of forming an interconnect structure, comprising:
forming a trench opening within a dielectric material layer located on a substrate, the trench opening comprising a plurality of first trench portions having a first width and at least one second trench portion having a second width greater than the first width, the at least one second trench portion separating the plurality of first trench portions from each other;
forming a first diffusion barrier layer over sidewalls and a bottom surface of the trench opening;
forming a first liner layer over the first diffusion barrier;
forming a first conductive material layer to fill the plurality of first trench portions of the trench opening;
forming a second diffusion barrier layer on portions of the first liner layer and ends of the first conductive material layer exposed by the at least one second trench portion of the trench opening;
forming a second liner layer over the second diffusion barrier layer; and
forming a second conductive material layer to fill the at least one second trench portion of the trench opening.

16. The method of claim 15, wherein the forming the first conductive material layer is performed by a reflow process.

17. The method of claim 16, the reflow process only fills the plurality of the first trench portions, but not the at least one second trench portion.

18. The method of claim 16, wherein the reflow process is carried out in an environment comprising He, Ar, Ne, $N_2$, $H_2$, or a mixture thereof.

19. The method of claim 16, wherein the reflow process is carried out at a temperature ranging from 100° C. to 400° C.

20. The method of claim 15, wherein each of the plurality of first trench portions has a length equal to or less than a Blech length.

21. The method of claim 20, wherein the length of each of the plurality of first trench portions is from 2 μm to 6 μm.

22. The method of claim 15, wherein each of the first diffusion barrier layer and the second diffusion barrier layer comprises Ta, TaN, W, WN, Ti, TiN, Ta/TaN, Ta/TaN/Ta, or Ti/TiN.

23. The method of claim 15, wherein each of the first liner and the second liner layer comprises Ru, Ir, Os, Rh, Re, Pd, Pt, Au, or alloys thereof.

24. The method of claim 15, further comprising removing portions of the second conductive material layer, the second liner layer, the second diffusion barrier layer, the first conductive material layer, the first liner layer, and the first diffusion barrier layer from a top surface of the dielectric material layer.

25. The method of claim 15, further comprising removing horizontal portions of the second liner layer and the second diffusion barrier layer prior to the forming the second conductive material layer.

* * * * *